(12) United States Patent
Takahashi

(10) Patent No.: US 6,937,434 B2
(45) Date of Patent: Aug. 30, 2005

(54) MAGNETIC FIELD SENSOR UTILIZING ANOMALOUS HALL EFFECT MAGNETIC FILM

(75) Inventor: Hiromasa Takahashi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/912,176

(22) Filed: Aug. 6, 2004

(65) Prior Publication Data

US 2005/0007694 A1 Jan. 13, 2005

Related U.S. Application Data

(63) Continuation of application No. 10/076,546, filed on Feb. 19, 2002, now Pat. No. 6,791,792.

(30) Foreign Application Priority Data

Aug. 24, 2001 (JP) ....................................... 2001-254930

(51) Int. Cl.[7] ................................................. G11R 5/37
(52) U.S. Cl. ...................................................... 360/112
(58) Field of Search ............................ 360/112; 324/251

(56) References Cited

U.S. PATENT DOCUMENTS

| | | | |
|---|---|---|---|
| 4,772,929 A | 9/1988 | Manchester | 257/422 |
| 5,093,753 A | 3/1992 | Friederich et al. | 360/112 |
| 5,166,849 A | 11/1992 | Fedeli | 360/112 |
| 5,521,500 A | 5/1996 | Schuhl et al. | 324/249 |
| 5,543,988 A | 8/1996 | Brady et al. | 360/112 |
| 5,652,445 A | 7/1997 | Johnson | 257/295 |
| 5,657,189 A | 8/1997 | Sandhu | 360/112 |
| 6,195,228 B1 | 2/2001 | Bennett et al. | 360/112 |
| 6,741,494 B2 * | 5/2004 | Johnson | 365/158 |
| 6,809,514 B2 * | 10/2004 | Ashley et al. | 324/251 |
| 2004/0251506 A1 * | 12/2004 | Johnson et al. | 257/421 |

FOREIGN PATENT DOCUMENTS

| | | | |
|---|---|---|---|
| JP | 59-227023 A | * | 12/1984 |
| JP | 2308409 | | 12/1990 |
| JP | 4358310 | | 12/1992 |
| JP | 9289344 | | 11/1997 |
| JP | 11-121833 A | * | 4/1999 |

* cited by examiner

*Primary Examiner*—Jefferson Evans
(74) *Attorney, Agent, or Firm*—Mattingly, Stanger, Malur & Brundidge, P.C.

(57) ABSTRACT

A magnetic field sensor for sensing an applied magnetic field by utilizing a Hall effect. Used, as a sensor portion, are compound materials such as FeN showing a significant anomalous Hall effect, and materials containing magnetic properties such as a magnetic semiconductor having a zincblende structure and oxide having a perovskite structure. A device structure of the magnetic field sensor is adopted, in which by providing a current terminal to a film and a voltage terminal thereof respectively in a film thickness direction and in an in-plane direction, the magnetic field can be guided into the in-plane direction.

14 Claims, 13 Drawing Sheets

FIG.16
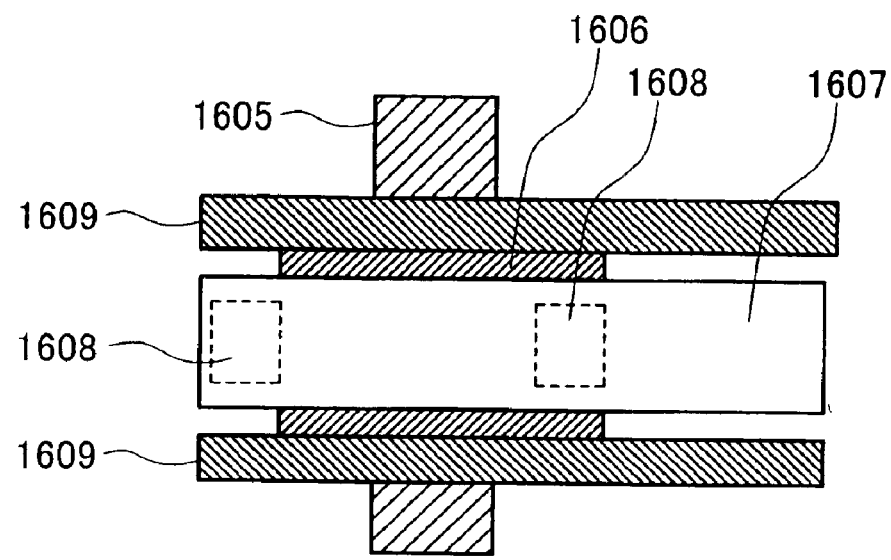
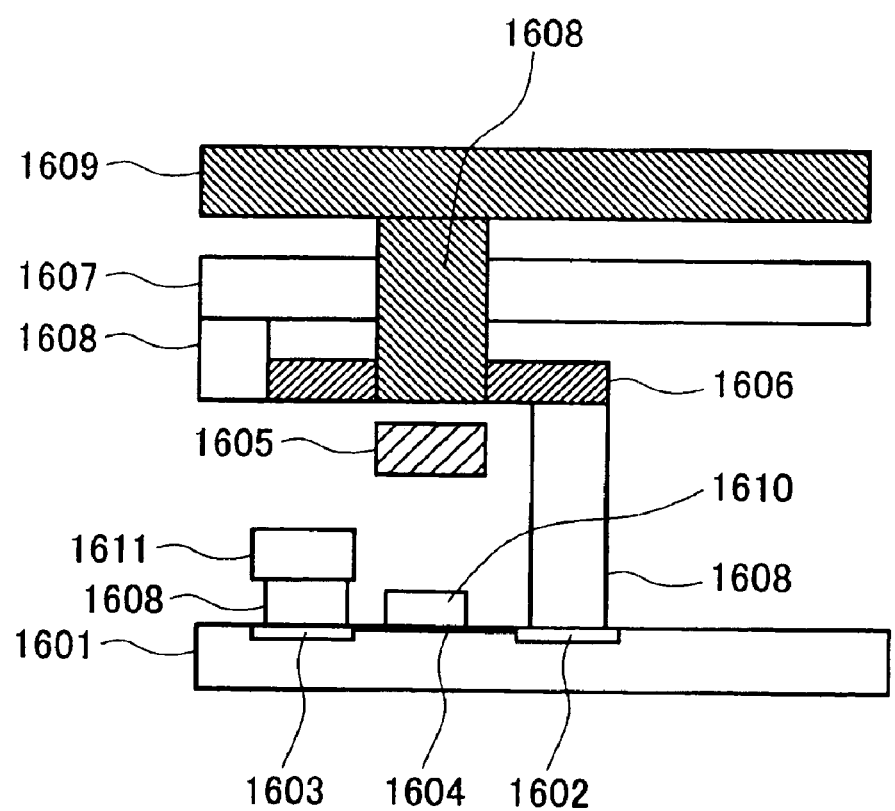

MAGNETIC FIELD SENSOR UTILIZING ANOMALOUS HALL EFFECT MAGNETIC FILM

The present application is a continuation of application Ser. No. 10/076,546, filed Feb. 19, 2002, now U.S. Pat. No. 6,791,792, the contents of which are incorporated herein by reference.

BACKGROUND OF THE INVENTION

The present invention relates to a magnetic sensor for sensing magnetic fields and a magnetic reading head for reproducing information recorded onto a magnetic disc, and particularly to a magnetic sensor and a magnetic reading head, which offer excellent reproduction and resolution.

DESCRIPTIONS OF THE RELATED ARTS

Magnetic recording/reproduction apparatuses have made remarkable improvements in their recording densities. Magnetic recording/reproduction heads thereof have been required to possess high performance in terms of both recording and reproduction characteristics. Concerning reproduction devices, improvements of three technical points have been demanded: (1) an improvement in a high sensitivity technique, (2) an improvement in a narrowing technique of a track width, and (3) an improvement in a narrowing technique of a reproduction gap. As to the point (1), the high sensitivity of the reproduction device has been advanced by improving a MR head utilizing a magnetoresistive effect. In a low recording density of several $Gb/in^2$, the MR head converted a magnetic signal recorded on a recording medium to an electric signal by use of an anisotropic magnetoresistive effect (AMR), and when the recording density became high so as to exceed several $Gb/in^2$, the MR head coped with this high recording density by use of a giant magnetoresistive effect (GMR) capable of producing higher sensitivity. With regard to the magnetic head utilizing the GMR, a structure called a spin valve is described, for example, in Japanese Patent Laid-Open No. 4(1992)-358310. The spin valve consists of a fixed layer made of a magnetic substance in which magnetization is fixed in a specified direction by an antiferromagnetic layer, and a free layer made of a magnetic film laminated on the fixed layer with a nonmagnetic thin film interposed therebetween. The spin-valve changes its electric resistance in response to a relative angle between the magnetization directions of the fixed and free layers.

However, with the recent development as to the high sensitivity of the reproduction device, a novel reproduction system for coping with further high sensitivity has been required. As likely reproduction systems, an advanced GMR effect called a specular-GMR or a NOL-GMR, in which a high spin polarization material or an oxide layer is sandwiched between interfaces of a GMR structure, and an increase of outputs is aimed at by a multi-reflective effect of spins of electrons; a GMR (CPP-GMR) which adopts a system for allowing a detection current to flow in a direction perpendicular to a film plane; and a tunneling magnetoresistive effect (magnetic tunnel junction effect) (TMR) are nowadays prospective.

These effects apply magnetoresistivity change phenomenon in a magnetoelectric effect. Herein, a Hall effect is also a kind of magnetoelectric effects, and a phenomenon in which when a magnetic field is applied in a direction perpendicular to a current flowing through a substance, a voltage is generated in a direction perpendicular to both of the current and the magnetic field. The Hall effect has been recognized for a long time, in which a carrier density and a scattering constant of electrons participate. The Hall effect has been applied to magnetic field measurements by use of a Hall generator formed of a semiconductor as that substance. The attempts to apply the Hall effect to the magnetic reading head are disclosed in Japanese Patent Laid-Open No. 2(1990)-308409 and the like. In this case, similarly to the Hall generator formed of a semiconductor, proposed are a system in which four electrode terminals as current terminals and voltage terminals are provided in a film plane and a signal magnetic field perpendicular to the film plane is measured; and a differential mechanism for sensing an inversion portion of a magnetic field by using a structure in which the two films are superposed thus forming an element having a thickness smaller than a bit interval of a magnetic recording. In Japanese Patent Laid-Open No. 9(1997)-289344, a fundamental principle for an in-plane magnetic recording is proposed as the magnetic field sensor utilizing an anomalous Hall effect of 3d-metal.

In a case where a structure of a reproduction device in future is considered, when the recording device adopts the conventional in-plane magnetic recording system, it is difficult for the recording device to produce a sufficient recording magnetic field, and the CPP-GMR and the TMR that are magnetic resistance sensors showing a high sensitivity are magnetic field sensors utilizing a structure for allowing a sensing current to flow perpendicularly to the film plane. Accordingly, it is anticipated that the reproduction device will switch over a structure of the CPP type through which a sensing current flows. However, when such a structure is adopted and a device area of the magnetoresistive sensor film is made small, a volume of a thickness of the magnetic film constituting the sensor film becomes small with the microfabrication and the thinness of the magnetoresistive sensor device, and its magnetization fluctuates by thermal fluctuation. Accordingly, a new problem that a predetermined magnetization ratio cannot be secured occurs.

When the Hall effect is utilized, materials of the current semiconductor Hall generator fundamentally show a linear output voltage for a magnetic field. Accordingly, the Hall generator demonstrates an advantage in measuring the magnetic field in a wide range. However, the Hall generator shows a small output for a micro magnetic field. Moreover, since these semiconductor materials are generally nonmagnetic (antimagnetic), it is difficult to concentrate a stray magnetic field from a recording medium on a sensing portion in the case where the magnetic field sensor is constituted by the Hall generator, and to enhance sensitivity. When the high-sensitive magnetic field sensor is fabricated with such a film, a structure capable of concentrating the magnetic filed on the sensing portion must be adopted, and a sensor film showing a large output for the magnetic field is necessary.

SUMMARY OF THE INVENTION

In consideration for the problems of the magnetic field sensor utilizing the Hall effect, an object of the present invention is to provide a magnetic field sensor having a structure which can be applied to magnetic reading heads and magnetic random access memories (MRAM).

To achieve the foregoing object, in the present invention, the magnetic field sensor is constituted by use of a material showing an anomalous Hall effect (magnetically induced Hall effect). This magnetic field sensor is applied with a magnetic field to detect a signal containing anomalous Hall effect components.

FIG. 1 shows a relation between a magnetic field B of a material showing the Hall effect and a material showing the anomalous Hall effect and a Hall voltage thereof. The conventional magnetic field sensor, particularly the Hall generator, which utilize the Hall effect (normal Hall effect), use a nonmagnetic semiconductor such as InSb. As apparent from FIG. 1, an output (Hall resistance) $\rho_H$ at this time is expressed as follows, $$\rho_H = R_H B$$

where B is an applied magnetic field (magnetic flux density), and $R_H$ is a Hall constant. The output $\rho_H$ is a value in proportion to the applied magnetic field B, and the Hall constant RH is in inverse proportion to a carrier density of a substance forming the sensor. On the contrary, when a material showing the Hall effect is a magnetic substance, the output (Hall resistance) $\rho_H$ is expressed as follows, $$\rho_H = R_H B + R_S M$$

where B is an applied magnetic field (magnetic flux density), M is magnetization of the magnetic substance, and $R_S$ is an anomalous Hall constant. The output $\rho_H$ contains components in proportion to the magnetization M. Moreover, the anomalous Hall constant $R_S$ has a value anticipated by fluctuations of temperature and magnetization. Accordingly, in the magnetic substance having a soft magnetic property showing significant magnetic field dependency of the magnetization in a low magnetic field, since the output (Hall resistance) $\rho_H$ is in proportion to the magnetization M of the magnetic substance, a change of the anomalous Hall resistance in the low magnetic field, that is, a value of the anomalous Hall constant $R_S$, is large. Accordingly, in the present invention aiming at the provision of the sensor film for sensing a low magnetic field, if a material containing a magnetic material is used as the sensor film and an anomalous Hall effect peculiar to the magnetic substance is utilized, there is a possibility that a higher output value can be obtained.

A relation among a current direction, a magnetic field direction and an output voltage direction has been heretofore obtained in such a manner that electrodes are provided at four spots in the in-plane, a magnetic field is applied in a film thickness direction while allowing a current to flow in the in-plane, and a voltage generated in a direction perpendicular to a direction of the current in the film plane is obtained as an output. In the case where application of a Hall generator using an ordinary film to a structure such as a magnetic head is considered, when a film plane is made to be in parallel with a medium plane, a structure in which an electrode is disposed closer to the medium than to a sensor film opposite to the medium must be adopted. Accordingly, a thickness of the electrode is superposed on a device floating height in the ordinary magnetic head and a distance (effective floating height) between the sensor film and the medium plane is made larger, so that a magnetic field reaching to the sensor film becomes weak. On the contrary, a structure was devised, which is capable of sensing the magnetic field from the medium with minimum loss by adopting a Hall generator structure without an electrode on the plane opposite to the medium. This is made possible by allowing a current or a voltage to flow or occur in the film thickness direction.

At this time, in the case of an anomalous Hall generator, since the sensor film alone is a magnetic film, this is a structure in which a magnetic field is apt to concentrate at the sensor portion. However, to enhance efficiency of the magnetic field concentration, a periphery thereof is constituted by a magnetic circuit structure, and a Yoke structure or a flux-guided type structure, in which a part thereof is constituted by the sensor film, is adopted. Accordingly, an output efficiency for the magnetic field can be improved.

As a material showing such an anomalous Hall effect, ferromagnetic metal by 3d-electrons, such as iron, cobalt and nickel, and alloys have been heretofore conceived. For example, since the anomalous Hall effect produced by a material added with impurities frequently tends to increase approximately in proportion to an impurity concentration and electrical resistance (there are a component in direct proportion to the impurity concentration and the electrical resistance and a component in square-proportion thereto), metallic materials added with impurity are conceived. As understood based on recent researches, in a part of materials such as LaSrMnO and LaCaMnO having a composition at a boundary area between an antiferromagnetic substance and a ferromagnetic substance, energy accompanied with an electron correlation rules physical properties of a system, and some materials show a critical state between an antiferromagnetic property and a ferromagnetic property in their certain composition. Thus, fluctuations of individual spins tend to be large, and at this time, a large anomalous Hall resistance may be observed. In a magnetic semiconductor constituted of a material obtained by combining a magnetic substance and a semiconductor, it has been found that a large moment and a large anomalous Hall effect can be observed. Particularly, in a diluted magnetic semiconductor obtained by doping a magnetic substance such as Mn into a III–V group compound semiconductor having a zincblende type crystal structure, a magnetic semiconductor obtained by doping transition metal into ZnO and GaN, and a magnetic semiconductor having the other zincblende type crystal structure, a high anomalous Hall effect material exists, which shows a ferromagnetic behavior at room temperature and has an anomalous Hall constant of $1 \times 10^{-11}$ Vcm/AG (volt centimeter/ampere gauss) or more at room temperature. Accordingly, it is possible to fabricate a magnetic field sensor with a desired output or a magnetic device using this magnetic field sensor, by using these materials for the sensor portions.

The magnetic field sensor and the magnetic reading head of the present invention have the following features.

(1) A magnetic field sensor comprises: a film of a first electrode; a magnetic film showing an anomalous Hall effect, formed on the film of the first electrode; a film of a second electrode formed on the magnetic film; and third and fourth electrodes respectively connected to two regions provided so as to be apart from each other along a film plane direction of the magnetic film.

(2) In the magnetic field sensor defined in the item (1), the magnetic film is a ferromagnetic film or an antiferromagnetic film which contains at least one sort of elements selected among iron, cobalt, nickel and manganese.

(3) In the magnetic field sensor defined in the item (1), the magnetic film is a ferromagnetic film or an anti-magnetic film formed of a compound consisting of at least one sort of elements selected among iron, cobalt, nickel, manganese, vanadium and chromium, and a semiconductor material having a zincblende type structure, which contains at least one of gallium, arsenic, indium, antimony, silicon, germanium, tellurium, zinc oxide and titanium oxide.

(4) In the magnetic field sensor defined in the item (1), the magnetic film is a ferromagnetic film or an anti-magnetic film formed by laminating a semiconductor material which contains at least one sort of elements selected among iron, cobalt, nickel, manganese, vanadium and chromium, and which contains at least one of gallium, arsenic, indium, antimony, silicon, germanium, tellurium, zinc oxide and titanium oxide.

(5) In the magnetic field sensor defined in the item (1), the magnetic film is a ferromagnetic film or an antiferromagnetic film having a perovskite structure which contains elements not less than three, which are selected among lanthanum, strontium, calcium, manganese, boron, copper and oxygen.

(6) A magnetic field sensor comprises: a film of a first electrode; a magnetic film showing an anomalous Hall effect, formed on the film of the first electrode; a film of a second electrode formed on the magnetic film; and third and fourth electrodes respectively connected to two regions provided so as to be apart from each other along a film plane direction of the magnetic film, wherein a current is allowed to flow between the first and second electrodes and a voltage generated between the third and fourth electrodes is detected.

(7) A magnetic field sensor comprises: a film of a first electrode; a magnetic film showing an anomalous Hall effect, formed on the film of the first electrode; a film of a second electrode formed on the magnetic film; and third and fourth electrodes respectively connected to two regions provided so as to be apart from each other along a film plane direction of the magnetic film, wherein a current is allowed to flow between the third and fourth electrodes and a voltage generated between the first and second electrodes is detected.

The magnetic field sensor and the magnetic reading head should provide a magnetic domain-control layer for controlling Barkhausen noises, which is formed of a permanent magnet material and arranged on both sides of the magnetic film showing an anomalous Hall effect. The magnetic reading head of the present invention can be incorporated in a magnetic recording/reproduction apparatus which performs recording/reproduction for a magnetic disc.

BRIEF DESCRIPTION OF THE DRAWINGS

FIG. 16 is a schematic view showing a structure of a MRAM using the magnetic sensor of the present invention.

DETAILED DESCRIPTION OF THE PREFERRED EMBODIMENTS

Embodiments of the present invention will be described with reference to the accompanying drawings below.

[Embodiment 1]

Figure 1:
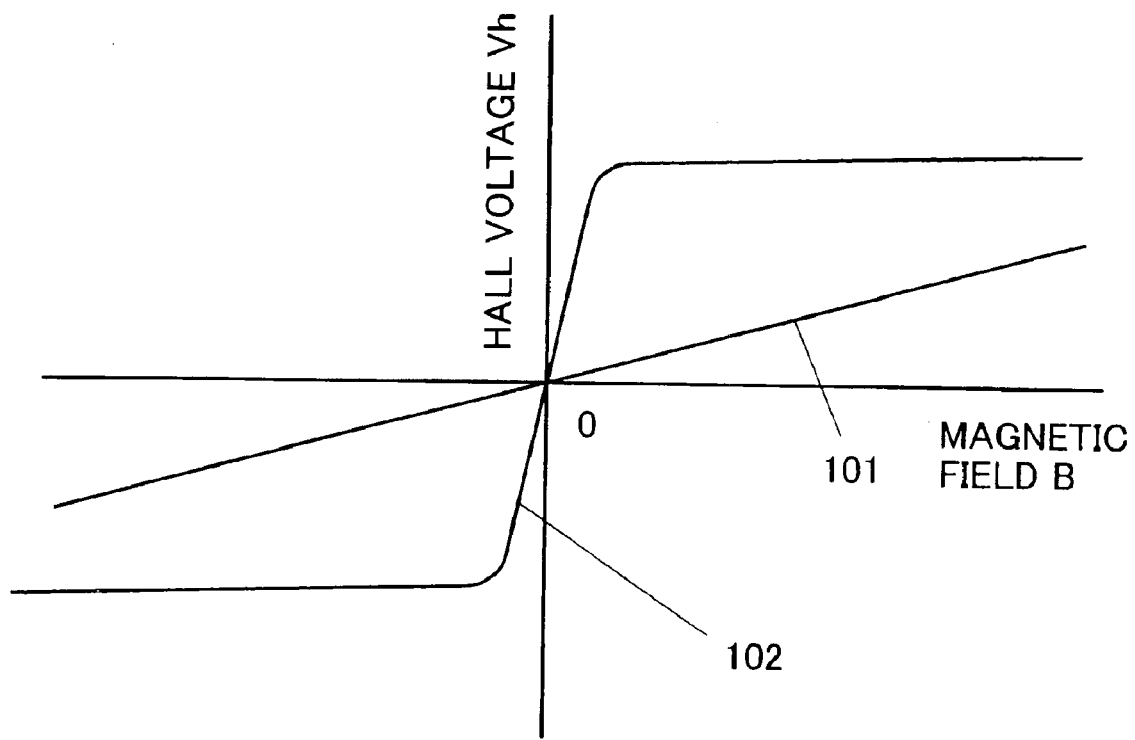
FIG. 1 is a drawing showing dependency of a Hall voltage of a general semiconductor on a magnetic field, along with another semiconductor showing an anomalous Hall effect and a Hall voltage.
Figure 2:
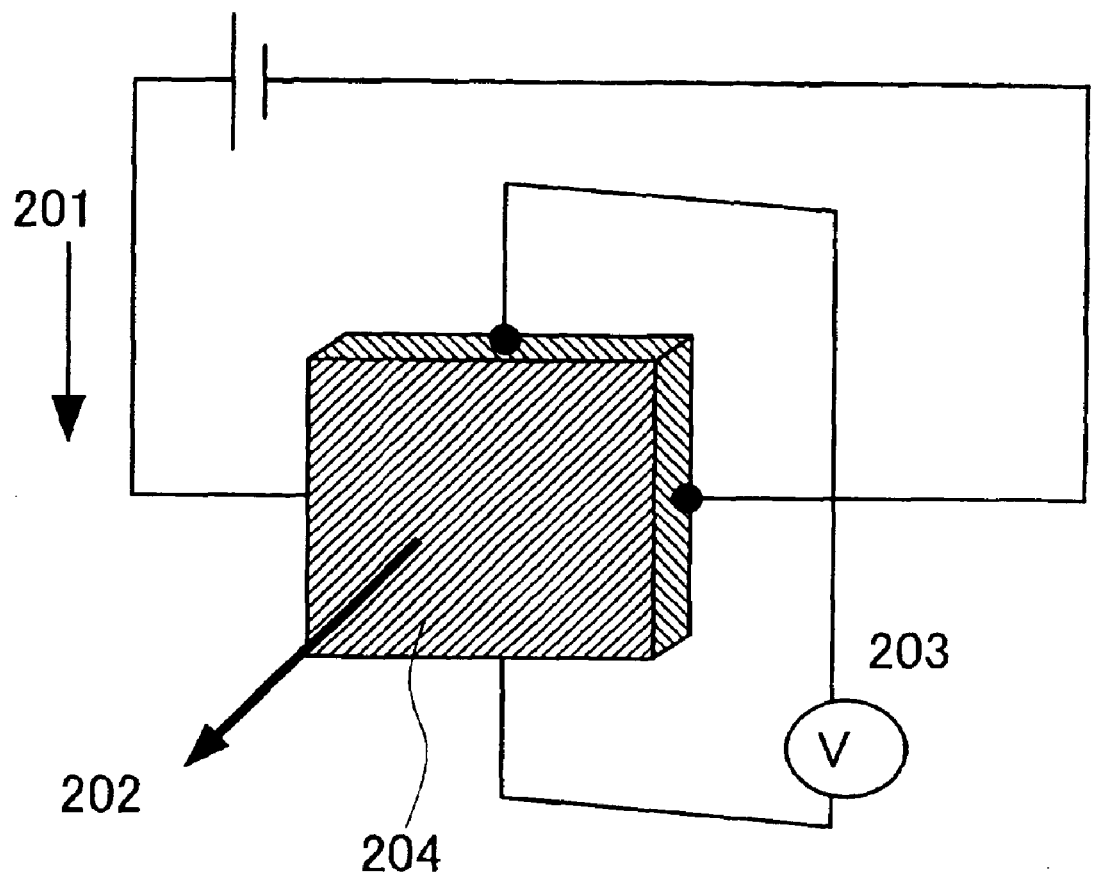
FIG. 2 is a structural view showing a relation among a current, a magnetic field and an output of a conventional thin film magnetic field sensor utilizing a Hall effect.

FIG. 2 is a schematic view showing a conventional thin film Hall generator, and a conventional thin film magnetic field sensor utilizing a Hall effect. FIG. 2 constitutes the magnetic field sensor which applies a phenomenon in which electromotive force is generated in a direction 203 perpendicular to both of an in-plane direction 201 and a film thickness direction 202 when a current is supplied to the direction 201 and a magnetic field is applied to the direction 202, and the magnetic field sensor measures an intensity of the magnetic filed applied to the film plane as the electromotive force. As a material constituting the thin film Hall generator, nonmagnetic semiconductors such as GaAs, InAs and InSb which offer a nature that a magnetic field and a voltage are in proportion to each other in a wide range of the magnetic field have been reported and widely put into practical use.

Figure 3:
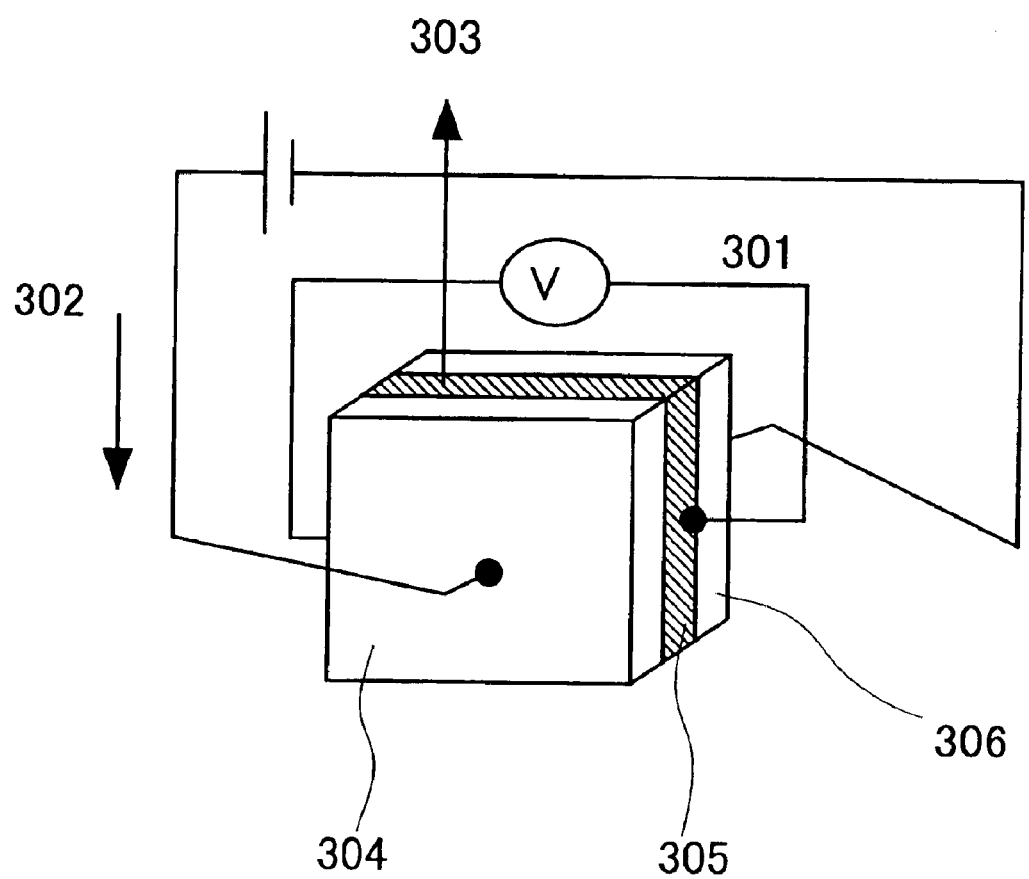
FIG. 3 is a structural view showing an example of a relation among a current, a magnetic field and an output of a thin film magnetic field sensor of the present invention utilizing an anomalous Hall effect.

On the contrary, the magnetic field sensor of the present invention has a constitution, for example, as shown in FIG. 3. The magnetic field sensor of FIG. 3 has a structure in which a sensor film (a film containing ferromagnetic which generates an anomalous Hall effect) 305 is sandwiched by two electrodes 304 and 306, and senses an output voltage generated in a film plane direction 301 when a magnetic field is applied to an in-plane direction 303 while allowing a current to flow in a film thickness direction 302. A material constituting the sensor film is the one constituted by a film containing a magnetic film ferromagnetic or antiferromagnetic, and details of the material constituting the magnetic field sensor will be described later.

Figure 4:
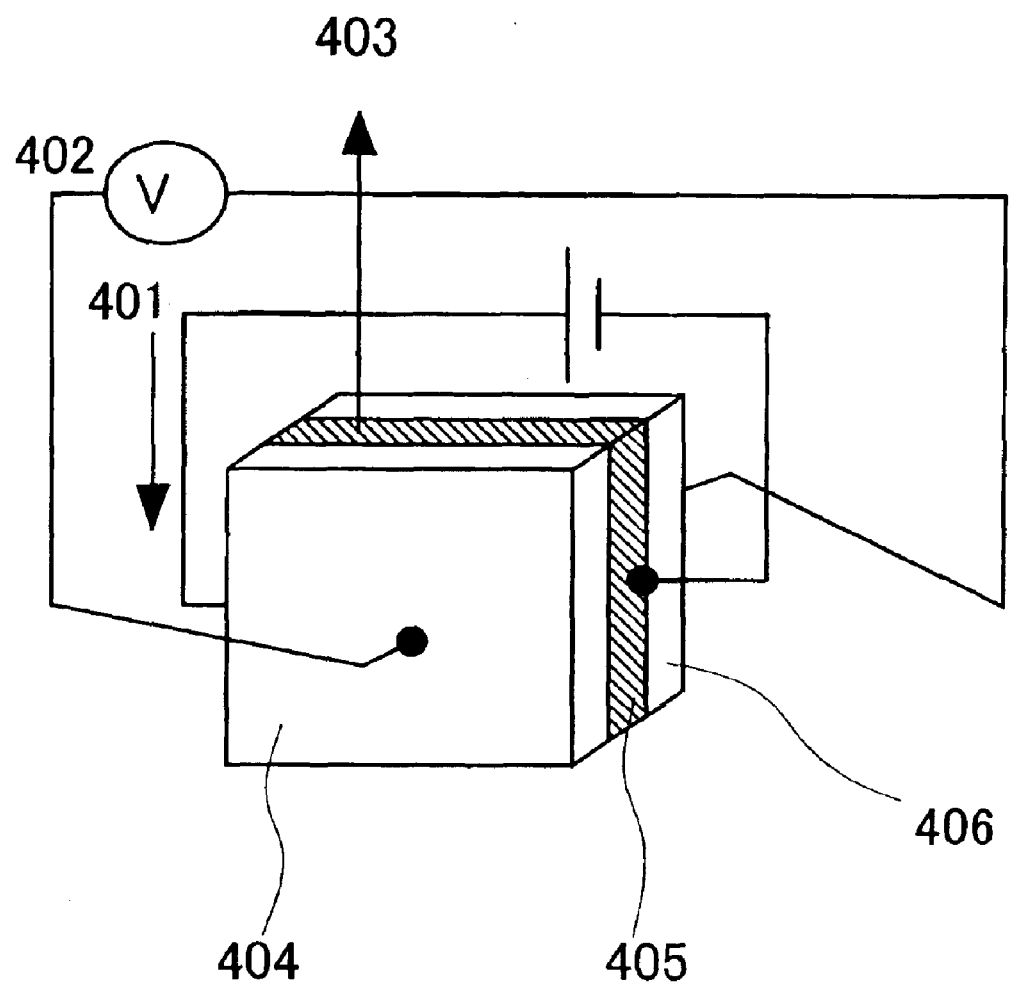
FIG. 4 is a structural view showing another example of a relation among a current, a magnetic field and an output of a thin film magnetic field sensor of the present invention utilizing an anomalous Hall effect.

FIG. 4 shows another constitution example of the magnetic field sensor of the present invention. The magnetic field sensor of this example has a structure in which a sensor film (a film containing ferromagnetic which generates an anomalous Hall effect) 405 is sandwiched by two electrodes 404 and 406, and senses a voltage generated in a film thickness direction 402 relative to a magnetic field which enters in the in-plane direction 403 while allowing a current to flow in an in-plane direction 401 perpendicular to the in-plane direction 403. As the sensor film, a film containing a magnetic film containing ferromagnetic or antiferromagnetic is used. Both of the magnetic field sensors shown in FIGS. 3 and 4 have shapes in which the magnetic field enters from a film section portion.

Figure 5:
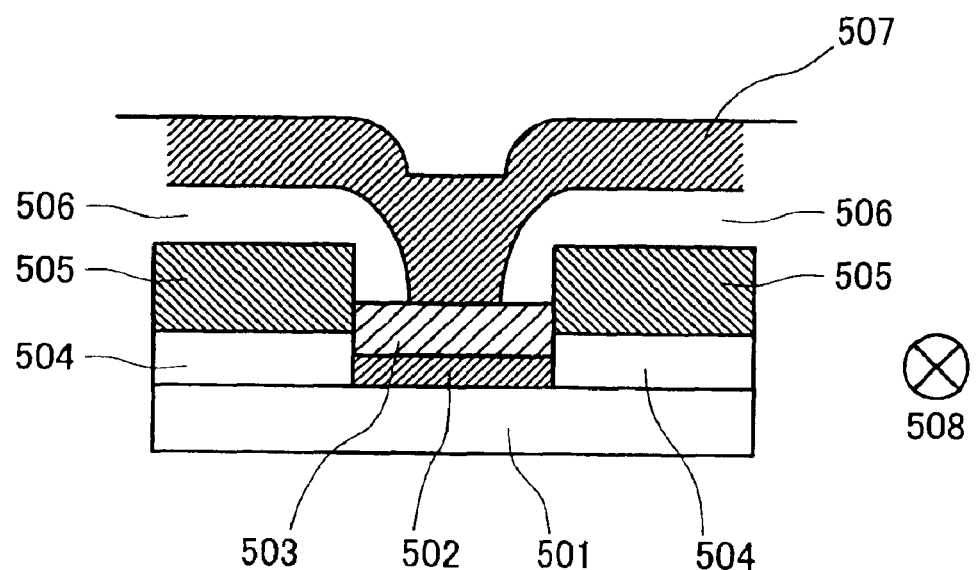
FIG. 5 is a schematic section view showing an example of a magnetic field sensor of the present invention, which is viewed from a plane which faces a medium.
Figure 6:
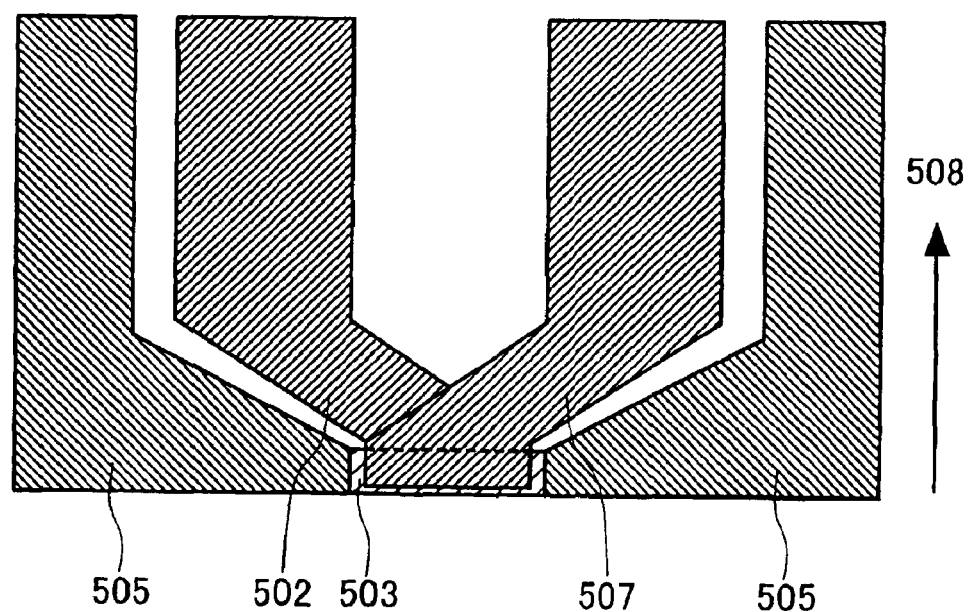
FIG. 6 is a drawing showing an example of the magnetic field sensor of the present invention, which is viewed from a direction of a film plane above the magnetic field sensor.

In FIG. 5, a constitution example of the magnetic field sensor described in FIG. 3 is shown when viewed from a plane facing a medium plane. Moreover, a constitution example of the magnetic field sensor when viewed just from above is shown in FIG. 6.

Referring to FIG. 5, an electrode film 502 is formed on a substrate 501 by use of a sputtering method, for example, in an Ar atmosphere, and a sensor film 503 is formed on the electrode film 502. As a material constituting the substrate, a semiconductor single crystal (GaAs, Si, doped semiconductor (InGaAs), InP and the like), a single crystal (MgO, sapphire and the like), glass, silicon oxide, ceramics and the like are enumerated. When the substrate 501 was glass, oxide or ceramics, the substrate 501 was made in such a manner that an insulating film was formed on a substrate, the insulating film was processed to be flat by a chemical mechanical polishing (CMP) method, and a shield film made of magnetic was formed on the insulating film. Moreover, with respect to the flatness of the film plane, it is possible to reduce surface roughness to about 0.1 nm by performing a treatment for the film plane, in which cluster ions are irradiated onto the substrate plane. The substrate using this method was effective as a result of a device fabrication. The single crystal substrate was used after a clean and flat surface was formed by performing the foregoing surface treatment or by performing a heat treatment to elevate a substrate temperature at a range from 300° C. to 600° C. in a vacuum. As a fabrication method of the sensor film, a sputtering method, an ion-beam sputtering method, a molecular beam epitaxy (MBE) method, a chemical vapor deposition (CVD) method or a plating method can be, for example, adopted. Details of a material of the sensor film will be described later. As the substrate temperature, a proper temperature at a range from room temperature to several hundreds ° C. was appropriately set depending on sorts of the material, and was used. For example, Fe—N, MnGaAs and the like were fabricated at a substrate temperature of 250° C. and CrAs was fabricated at a substrate temperature of 200° C.

This sensor film was patterned to a predetermined size and a shape by use of a resist mask, and resist was peeled off after allowing other portions to undergo a removal treatment such as ion-milling. For example, after a so-called lift-off pattern was formed on the sensor film, the film composed of an insulating film 504 an electrode film 505 and an insulating film 506 was similarly formed. $Al_2O_3$ or $SiO_2$ was used for this insulating film. Moreover, an electrode film 507 was formed on the film. The electrode film 505 is made of, for example, Au, and the electrode film 505 may contact the sensor film 503 at an upper surface of the sensor film 503 or at a section of the sensor film 503 as long as the electrode film 505 is insulated from the electrode films 502 and 507 disposed on/under the sensor film 503. Alternatively, the electrode film 505 may contact both of the upper surface and the section of the sensor film 503. A drawing-out method of four electrodes from the electrode films 502, 505, 505 and 507 is shown in FIG. 6. Besides Au, Cu, Ru, Cr, Ta/Au/Ta, Al and the like can be used as the electrode material. This magnetic field sensor allows a current to flow from the electrodes 502 and 507 to the film thickness direction, and senses a voltage generated between the electrodes 505 and 505 as an output when a magnetic signal is input in a direction 508.

As to the sensor structure shown in FIG. 4, for example, the foregoing shape is used as a device shape, and approximately the same materials are used. In this case, the sensor structure allows a current to flow from the electrodes 505 and 505 in the in-plane, and senses a voltage generated between the electrodes 505 and 505 as an output when a magnetic signal is input in the direction 508.

With respect to a device structure of this embodiment and a relation between the current input thereto and the output voltage, in the structure shown in FIG. 3, for example, in the case where a shape of the device on the substrate is 2.0 $\mu m \times 0.5$ $\mu m$ and the film thickness dy is 0.2 $\mu m$, when the current I is allowed to flow in the film thickness direction, an area S of a portion where a current of the device flows is equal to 2.0 $\mu m \times 0.5$ $\mu m$. When a material offering the anomalous Hall constant Rs of $10^{-10}$ Vcm/AG (volt centimeter/ampere gauss) is used as a material for the sensor film, the output voltage $\Delta Vh$ (V) is expressed as follows.

$$\Delta Vh = Rs \cdot dy \cdot I \cdot M(H)/S$$

Specifically, a current required for obtaining a certain output voltage $\Delta Vh$ is expressed as follows.

$$I = \Delta Vh \cdot S/Rs \cdot dy \cdot M(H)$$

Note that the magnetic field is expressed as follows, assuming that a value of a magnetic flux density M(H) at a position floating by about 10 nm from a medium recording portion is 10000 G.

$$I = \Delta Vh \cdot S \cdot 10^{-4}/Rs \cdot dy$$

Assuming that it is impossible to allow the current to flow by a value equal to 1 mA at maximum, when the area of the device is 1 $\mu m^2$, $\Delta Vh$ is equal to 2 mV or less. This value is a measurable one. Accordingly, if the anomalous Hall constant Rs is equal to $10^{-10}$ Vcm/AG, it is a measurable value as the output. Since the device can be minimized by about one digit with a current technology using an electron beam (EB) lithography method, this value is appropriate for obtaining the output of the device as long as the anomalous Hall constant Rs is equal to $10^{-11}$ Vcm/AG or more.

Moreover, a method to increase this output voltage $\Delta Vh$ can fabricate the device outputting an output having a value larger than the conventional one by two digits or more by: (1) raising a current value, (2) reducing a device size (S), (3) using a high magnetization material, (4) researching materials showing a high anomalous Hall constant Rs, and (5) increasing the film thickness dy.

The output in the device is a value roughly calculated by the above-described equations with individual use of the anomalous Hall constant Rs and Ms when the material is changed in the same device structure.

On the contrary, in the case of the device structure shown in FIG. 4, in which a current is allowed to flow in the in-plane direction and an output terminal is drawn out in the film thickness direction, when the film thickness dy is 0.2 $\mu m$ and the anomalous Hall constant Rs is $10^{-10}$ Vcm/AG, an area of the portion of the device where the current flows is 0.5 μm×0.2 μm, and the output voltage ΔVh (V) is expressed by the following equation.

$$\Delta Vh = Rs \cdot 2.0(\mu m) \cdot I \cdot M(H)/S = 5 \times 10^{-4} \cdot I$$

When the device structure is simply compared to that shown in FIG. 3, the output voltage ΔVh becomes smaller, and it is also possible to calculate the output voltage ΔVh on the assumption that the film thickness of the device be 50 nm. In this case, the output voltage ΔVh is equal to 8×I(V), and a current necessary for obtaining an output of 1 V is 125 mA. Moreover, when the anomalous Hall constant Rs is $10^{-9}$ Vcm/AG, the current is 12.5 mA that is a value smaller than 125 mA by one digit, and the output becomes an appropriate value for the current. Accordingly, since an advantage that the output voltage ΔVh becomes larger is produced when the anomalous Hall constant Rs is sufficiently large, or when the sensor film thickness is thinner and the width thereof is narrower, there is a possibility that the output for a unit current is increased by these methods. Therefore, a shape of the sensor film should be advantageously adopted, in which the sensor film is made as thin as possible and a current path when viewed from above the film plane is made as long as possible. To be concrete, in the foregoing size, when the anomalous Hall constant Rs is $10^{-10}$ Vcm/AG or more, necessary conditions for the sensor are satisfied.

A magnetic field necessary for a rotation of in-plane magnetization can be adjusted by crystal magnetic anisotropy of the film and the shape thereof. In a soft magnetic film, effects produced by the shape can be estimated approximately by using ellipsoid. Particularly, a shape which is long in a direction of a difficult axis of the crystal magnetic anisotropy is adopted, whereby it is possible to provide a stable point in the direction of the difficult axis. When a shape having a ratio of a longer side to a shorter side that is 1:2 is adopted, these change remarkably. It is said that a film in which adjustment of the output and the magnetization is easy can be fabricated, based on the foregoing anisotropy and the calculation of the output, in the device having a ratio of a longer side to a shorter side that is 1:3 or more.

As a material for constituting the sensor film, for example, a film can be used which is fomed of: strong electron correlation materials such as (1) $Fe_{16}N_2$, (2) MnAs—GaMnAs, (3) CdMnTe, (4) InMnAs, (5) ZnO+ (more than one selected among Mn, V, Cr, Fe, Co, Ni and Ti), (6) ZnCoO, (7) CrAs and (8) LaCaMnO and LaSrMnO; anti-ferromagnetic containing Mn; or magnetic having a granular structure.

The film formed of (1) $Fe_{16}N_2$ is formed in the following manner. Specifically, this film can be formed in such a manner that Fe is evaporated on an $In_{0.2}Ga_{0.8}As$ (001) single crystal substrate, which is heated to 200° C., at a rate of 0.01 to 0.02 Å/sec in a nitrogen gas containing ammonium of 20% within an ultra high vacuum evaporation system (molecular beam epitaxy method). The substrate was dipped in a solution containing $H_2O$, $H_2O_2$ and $H_2SO_4$ at a ratio of $H_2O:H_2O_2:H_2SO_4=1:1:3$ for about 10 seconds, and then washed. Thereafter, a back of a substrate holder was heated to 640° C. in a vacuum, and it was confirmed by reflection high energy electron diffraction (RHEED) that the surface of the surface of the was clean. This material showed saturated magnetization of 3.0 T (tesla) and electrical resistance of 32 μΩcm at room temperature. Moreover, when a Hall effect was measured by a Van der Paw's method, RA increases as temperature rises, and an anomalous Hall constant of $2 \times 10^{-11}$ Vcm/AG at room temperature was brought about. This value is 3 to 4 times as large as pure Fe. It is possible to form a compound obtained by allowing 3d-metal series ferromagnetic metal to react with nitrogen, carbon and oxygen by use of a similar reactive evaporation method. For example, in the case of Fe—N martensite (N:5–11 atom %) formed by iron and nitrogen, RA is about $1.0 \times 10^{-11}$ Vcm/AG (ampere gauss).

The films formed of the materials of (2) and (3) are formed on a GaAs (001) surface in an ultra high vacuum by use of the MBE method. With respect to the film of (2), a compound film having a film thickness of about 200 nm at maximum, which is obtained by doping Mn to GaAs by about 5%, has an easy axis of magnetization in an in-plane, when this film is grown directly on the substrate. When a buffer layer containing InGaAs or the like is sandwiched, this compound film can be formed as the one having the easy axis of magnetization perpendicularly. This film shows an anomalous Hall resistance of $6 \times 10^{-6}$ Vcm/AG (40K) at a low temperature of 100 K or lower under the present conditions, and the film shows a smaller value than this value by about one to two digits at 150 K. Moreover, the material of (3) CdMnTe obtained by doping Mn of about 2% to CdTe shows a property of a magnetic semiconductor at a lower temperature.

The films formed of the materials from (4) to (7) can be formed by an ion beam method or the MBE method. Note that to form a zincblende type structure that is a characteristic crystal structure of these series, these films should be formed by use of the MBE method. InMnAs of (4) is obtained by doping Mn to InAs, and the film of InMnAs is formed on a GaAs substrate or an InAs substrate in a vacuum at a substrate temperature of 500 to 700° C. by use of the sputtering method and the ion beam method. The film becomes p-type or n-type conductivity depending on semiconductor impurities. A p-type film becomes ferromagnetic property at a low temperature and shows an anomalous Hall effect. The anomalous Hall constant Rs is within a range of $10^{-10}$ Vcm/AG. The material of (5) ZnO+(more than one selected among Mn, V, Cr, Fe, Co, Ni and Ti) is obtained by doping transition metal to ZnO that is a wide gap type semiconductor. It is reported that, according to a theoretical calculation based on a first principle, when Mn is doped, the material of (5) shows anti-ferromagentic property and ferromagnetic property, and when V, Cr, Fe, Co and Ni are doped, the material of (5) shows paramagnetic property. It is said that a film obtained by doping Mn to GaN may also show ferromagnetic property. Among these materials, as a remarkable example, ZnCoO of (6) shows ferromagnetic property also at room temperature, and has an anomalous Hall constant. CrAs of (7) is grown epitaxially on a (100) plane of GaAs crystal, shows ferromagnetic property at room temperature. Besides these materials, it has been confirmed that with respect to MnSb, a thin film formed of MnSb with a granular structure, in which each particle has a diameter of about 100 nm, shows ferromagnetic property at room temperature. Also an anomalous Hall constant with the range of the present invention can be obtained. The materials of (8) can show ferromagnetic property, antiferromagnetic property and superconductivity property depending on composition and temperature. Particularly, the materials of (8) show a large spin fluctuation near its composition demonstrating the antiferromagnetic property and the ferromagnetic property, and a region, for example, $La_{0.7}Ca_{0.3}MnO_3$ and $La_{0.7}Sr_{0.3}MnO_3$ where an anomalous Hall effect becomes significant exists. Moreover, a film obtained by laminating the film formed of the material of (3) on thin films formed of GaAs and MnGaAs shows the same properties.

Figure 7:
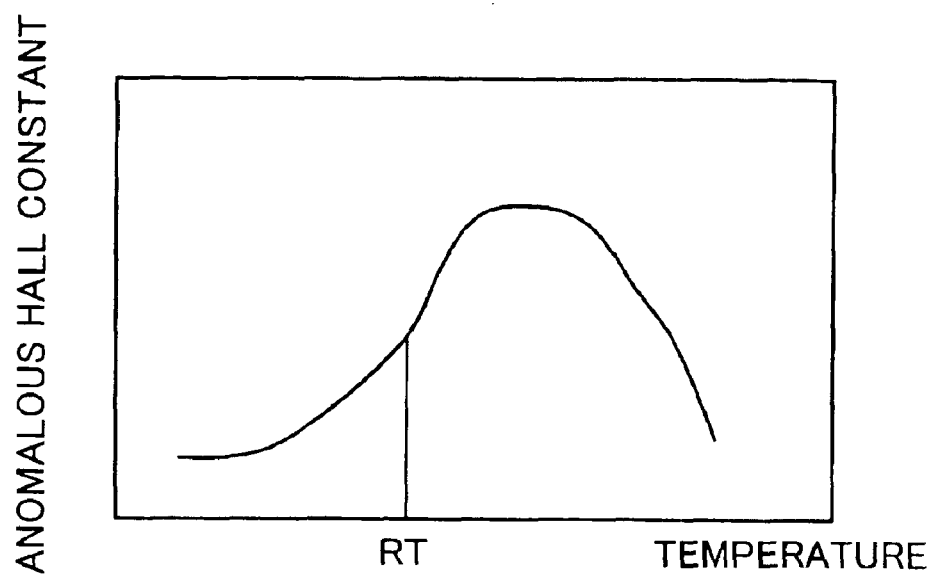
FIG. 7 is a graph showing dependency of an anomalous Hall effect on temperature.

According to Kondoh's theory, since the anomalous Hall constant Rs of the anomalous Hall effect is in proportion to $\Delta^3$ of the fluctuation of the magnetization, the anomalous Hall constant Rs itself becomes large particularly when a state where the spin fluctuation becomes large is brought about. In most of the foregoing cases, a state where a Coulomb interaction of electrons becomes peculiarly remarkable (strong electron correlation state) or a state where an interaction between spins is forcibly weakened is brought about, and thus it is considered that an anomalous Hall constant is made large. When a thin and minute film is formed from this material, a scaling law concerning the number of electrons will not hold, and it is anticipated that the spin fluctuation becomes large. It was confirmed that the anomalous Hall effect, at the time when a high temperature is produced to similarly make the spin fluctuation large, practically becomes large as shown in FIG. 7. The anomalous Hall constant elevates in many cases as the temperature rises from room temperature (RT), as shown in FIG. 7. Particularly, among the above-described materials, the materials of (1), (5), (6) and (7) show such a feature. The remaining materials other than those of (1), (5), (6) and (7) show large anomalous Hall constant values at a low temperature because the peak shown in FIG. 7 is positioned at a temperature zone lower than room temperature.

[Embodiment 2]

A device of an embodiment 2 was fabricated in the following manner. Specifically, more than two devices having the structure of FIG. 3 or FIG. 4, each having the same shape and the same size, are disposed so that output terminals thereof are arranged in series and at least one current introduction terminal allows a current to flow in a direction inverse to those of other current introduction terminals.

Figure 8:
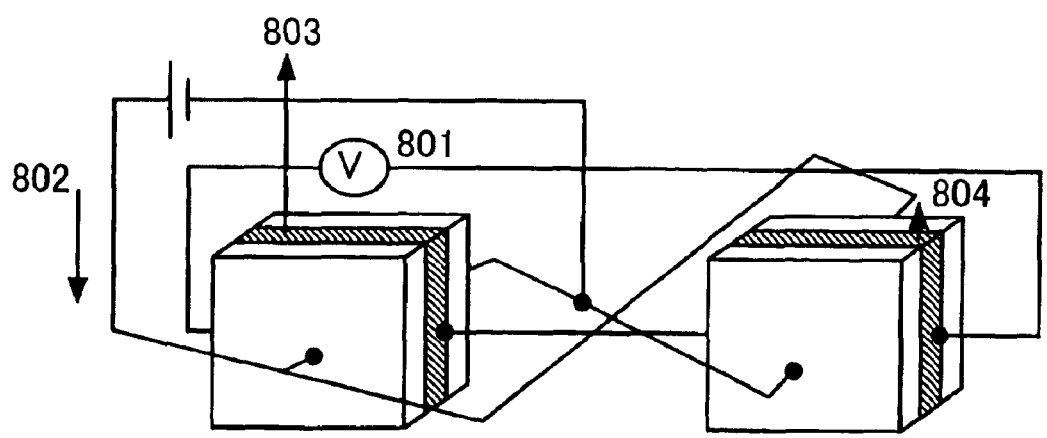
FIG. 8 is a structural view showing still another example of a relation among a current, a magnetic field and an output of a thin film magnetic field sensor of the present invention utilizing an anomalous Hall effect.

FIG. 8 shows an example of the device of the embodiment 2, and is a principle diagram of the magnetic field sensor in which the two magnetic field sensors having the same structure, the same size and the same shape as those of FIG. 3 are arranged, the output terminals (301) in plane are arranged in series, and the current terminals (302) are arranged so that the current 802 flows in series in film thickness directions opposite to each other. A material of a sensor film is the same as that described in the embodiment 1. Moreover, in terms of the device structure, one terminal of the current terminal is simply connected in a reverse direction to that of the other current terminal, and when the device is formed on the same substrate, the device can be formed easily. Accordingly, detailed descriptions of manufacturing steps of the device are omitted.

It is considered that the magnetic field sensor having this structure has a different function depending on a situation where the magnetic field sensor is set. As an example, when a magnetic field confusing a magnetic field wished to be measured exists in the outside, one device is located at a position where a magnetic field wished to be measured exists and the other device is located at a position where the magnetic filed confusing a magnetic field wished to be measured exists. Accordingly, a magnetic field sensor is realized, which cancels an anomalous Hall voltage output component due to the magnetic field confusing a magnetic field wished to be measured and can detect only the magnetic field wished to be measured. Specifically, the device located at the position where the magnetic field wished to be measured exists detects a magnetic field 803 in which a confusing magnetic field is superposed on the magnetic field wished to be measured. On the other hand, the device located at the position where the magnetic field confusing a magnetic field wished to be measured exists detects the confusing magnetic field 804. As a result, an output voltage 801 of the magnetic field sensor indicates an intensity of the magnetic field wished to be measured, which is obtained by subtracting the confusing magnetic field 804 from the magnetic field 803.

Describing an example of a method to use the magnetic field sensor, this method is the one in which the sensor film is arranged in a sensor portion of a magnetic reading head, and another sensor is arranged at a position apart from the sensor portion. The magnetic field sensor is effective when the magnetic field is wished to be measured by subtracting influences of a terrestrial magnetic field and a normal biasing field by a recording portion other than a magnetic recording portion wished to be reproduced.

Figure 9:
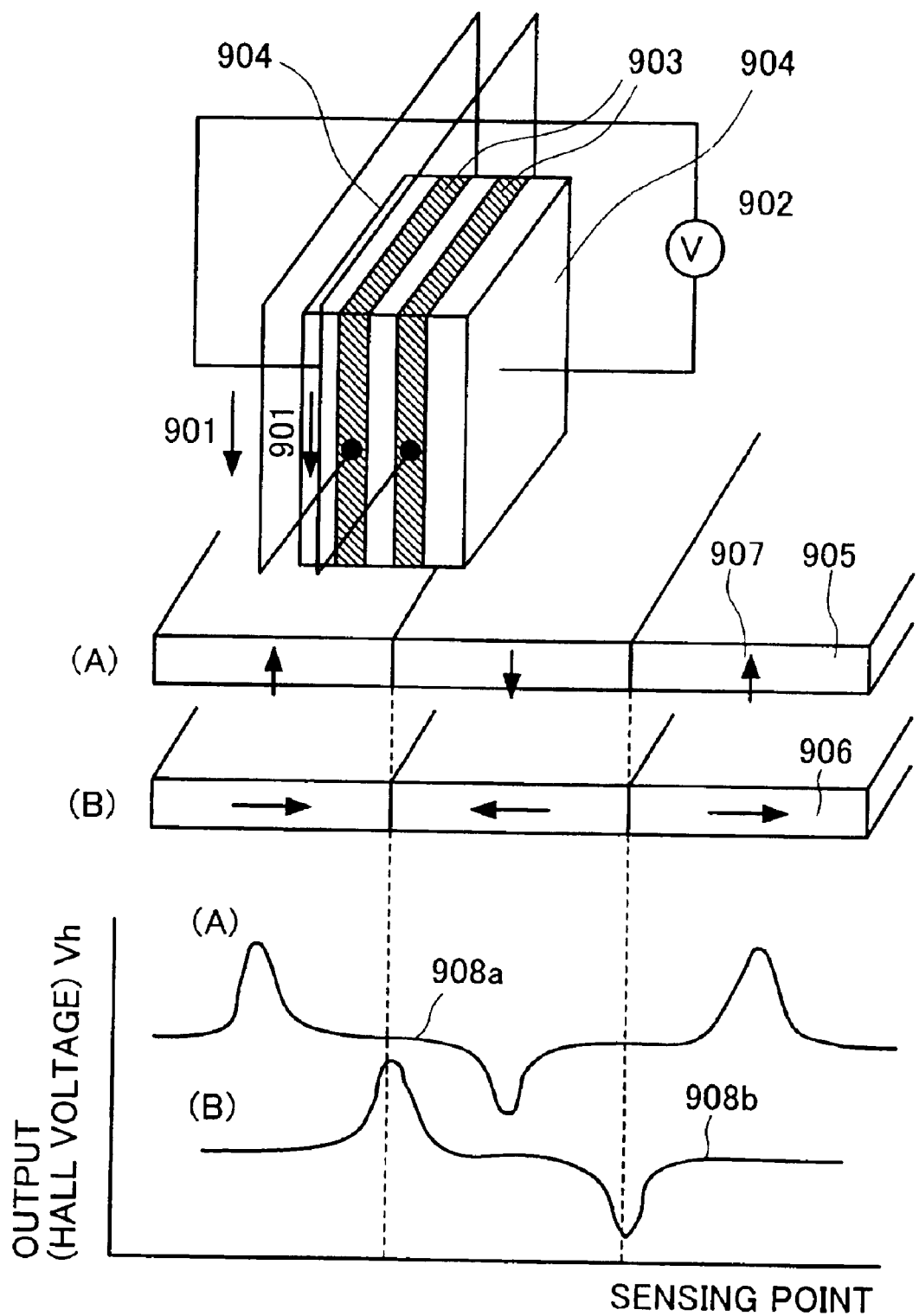
FIG. 9 is a drawing showing a structural view of another example of a reproduction head of the present invention, a magnetic recording state of a medium, and dependency of Vh on a location.

In FIG. 9, another structural example of the magnetic field sensor using two sensor films of the same shape and the same size is shown. The magnetic field sensor shown in FIG. 9 has a structure in which two sensor films 903 and 903 sandwiching an electrode film therebetween are further sandwiched by a pair of electrode films 904 and 904 therebetween. A current 901 is applied to the film plane direction of the two sensor films 903 and 903 containing ferromagnetic which causes an anomalous Hall effect, and an anomalous Hall voltage 902 generated in the film thickness direction by an interaction with an applied magnetic field is detected in series.

When the two sensor films 903 and 903 are arranged with a width narrower than a recording track width of a magnetic disc, and when this magnetic field sensor is used as a reproduction head for the magnetic disc, an output signal can be obtained differentially.

A case where a current is allowed to flow through the sensor films 903 and 903 in the same direction will be described. In the case where this magnetic field sensor is applied to a reproduction head of a magnetic disc, when a thickness of the device is narrower than a width of a recording portion, an output (Hall voltage) when a perpendicular magnetic recording medium 905, in which there is recording magnetization 907 perpendicular to the medium plane, is reproduced shows dependency on a location as shown in an output waveform 908*a*. The output shows dependency on a location as shown in an output waveform 908*b* when an in-plane magnetic recording medium 906, in which there is recording magnetization in the direction of the medium plane, is reproduced. When the direction of the current 901 is made be reverse, the output at the time when the perpendicular magnetic recording medium 905 is reproduced shows dependency on a location shown in the waveform 908*b*, and the output at the time when the in-plane magnetic recording medium 906 is reproduced shows dependency on a location shown in the waveform 908*a*. As described above, the magnetic field sensor of this embodiment can be used as a reproduction head for the in-plane magnetic recording medium as well as the perpendicular magnetic recording medium.

[Embodiment 3]

A case where the magnetic field sensor of the present invention is applied to a magnetic reading head will be described. A film containing ferromagnetic which causes an anomalous Hall effect used for the magnetic field sensor has, for example, a film structure as shown in FIG. 6, and has a structure described in the embodiment 1. A film thickness is set to an appropriate value ranging from 1 to 100 nm for the sake of an application of the magnetic field sensor to the reading head and for the sake of a practical output. In the case of this embodiment, a film having a thickness of 15 nm was used. Without depending on whether a structure, in which a sensor called an in-gap type is sandwiched between shields, is a head structure having a shape exposed to a plane opposite to the medium or a head structure in which a sensor called a yoke structure is not exposed and the sensor is disposed inside the yoke formed of C-character shaped soft magnetic, the magnetic reading head structure using these magnetic field sensors is roughly divided into (1) the one in which an electrode serves as a shield and (2) the one in which the electrode and the shield are separated. For the respective structures, (A) a structure in which there is a magnetic domain-control and (B) a structure in which there is no magnetic domain-control are conceived.

Figure 10:
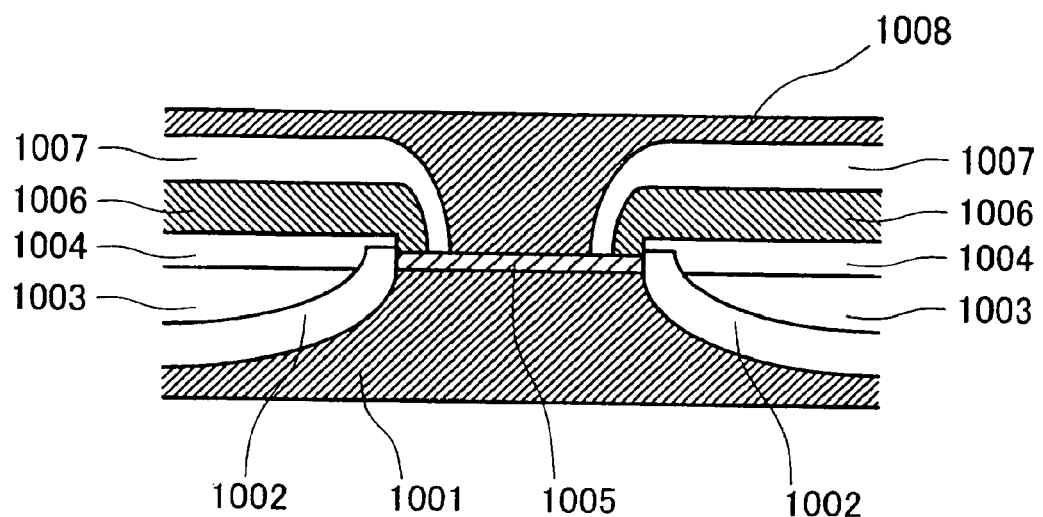
FIG. 10 is a structural view of an example of an in-gap type magnetic recording head of the present invention utilizing an anomalous Hall effect, which is viewed from a plane facing a medium, and in the drawing an electrode serves as a shield.

In FIG. 10, shown is a schematic view of a plane of the in-gap type device of the foregoing (1) opposite to the medium, in which an electrode serves as a shield. After the film formation, a lift-off material is coated onto a position, for example, a surface of a lower shield-cum-electrode film 1001, which serves as a magnetic sensing portion. After the formation, a sensor film 1005 that is a film including ferromagnetic causing an anomalous Hall effect is etched by the ion-milling method and the like. After the etching, an insulating film 1002, an electrode film 1006 and an insulating film 1007 are formed, and the lift-off mask is removed. When a magnetic domain-control film (hard biasing film (in order to make single magnetic domain structure)) 1003 formed of CoCrPt, $CoCrPtZrO_2$ or the like is formed between the insulating film 1002 and the electrode film 1006, under an insulating film 1004, or on the insulating film 1004, it is possible to further prevent noises due to magnetic domain behavior of the sensor film, so that magnetic field measurement precision can be enhanced. Herein, when the magnetic domain-control film 1003 is formed on a proper under layer such as Cr and Ta, the formation of this film has been sometimes effective in terms of properties of the magnetic domain-control film 1003. Thereafter, a pattern is formed on the magnetic domain-control film and the sensing portion in a direction of a device height, and a periphery portion thereof is removed by ion milling. Thereafter, a mixed film containing, for example, $Al_2O_3$ and $SiO_2$, is formed to a thickness of 100 nm as a protection insulating film 1007, and an upper shield film-cum-electrode film 1008 is formed.

Figure 11:
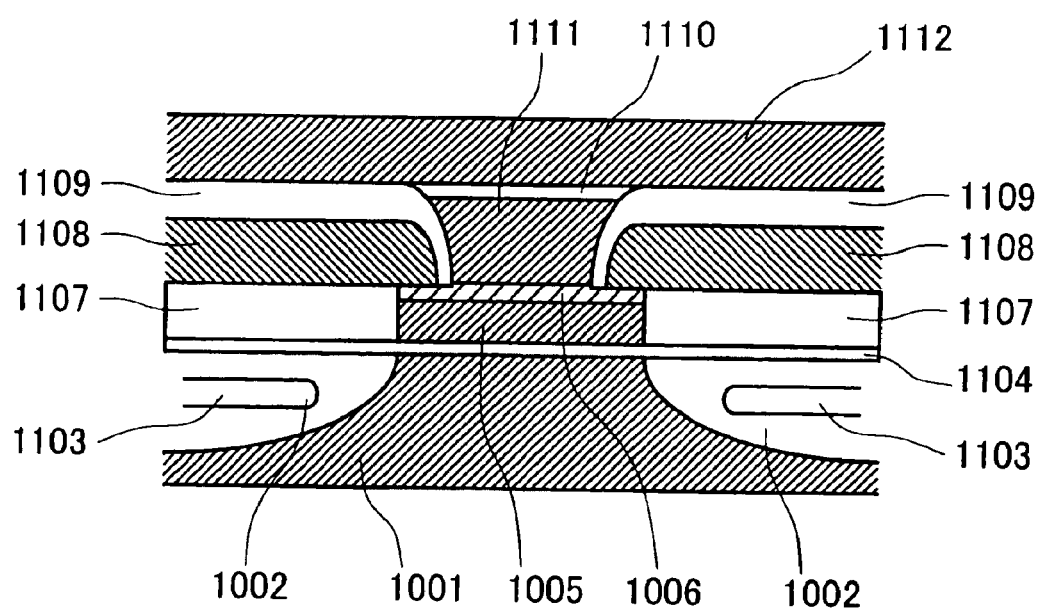
FIG. 11 is a structural view of an example of an in-gap type magnetic recording head of the present invention utilizing an anomalous Hall effect, which is viewed from a plane facing a medium, and in the drawing an electrode and a shield are separate from each other.

In FIG. 11, a schematic view of a plane of the in-gap type magnetic reading head device of the foregoing (2) opposite to the medium, in which an electrode and a shield are separated, is shown. In this case, after, for example, a lower shield 1101 is formed, a periphery of the lower shield 1101 is carved by use of a lift-off pattern, and a magnetic domain-control film 1103 is formed. The lower shield 1101 and the magnetic domain-control film 1103 are flattened, and then, by the CMP method, a gap insulating film 1104 is formed on the lower shield 1101 and the magnetic domain-control film 1103. Then, an electrode film 1105 and a sensor film 1106 are formed, and the resultant structure is processed to a device shape. An insulating film 1107 is formed around the electrode film 1105 and the sensor film 1106, and a lift-off pattern is formed in the device portion. An electrode film 1108 and an insulating film 1109, which extend laterally, are formed thereon, and subsequently the lift-off pattern is peeled off. Thereafter, an upper electrode 1111, the insulating film 1109 (upper gap film 1110) and an upper shield 1112 are formed. In the above-described manner, the magnetic reading head device can be fabricated. Note that reference numeral 1102 is an insulating film.

Figure 12:
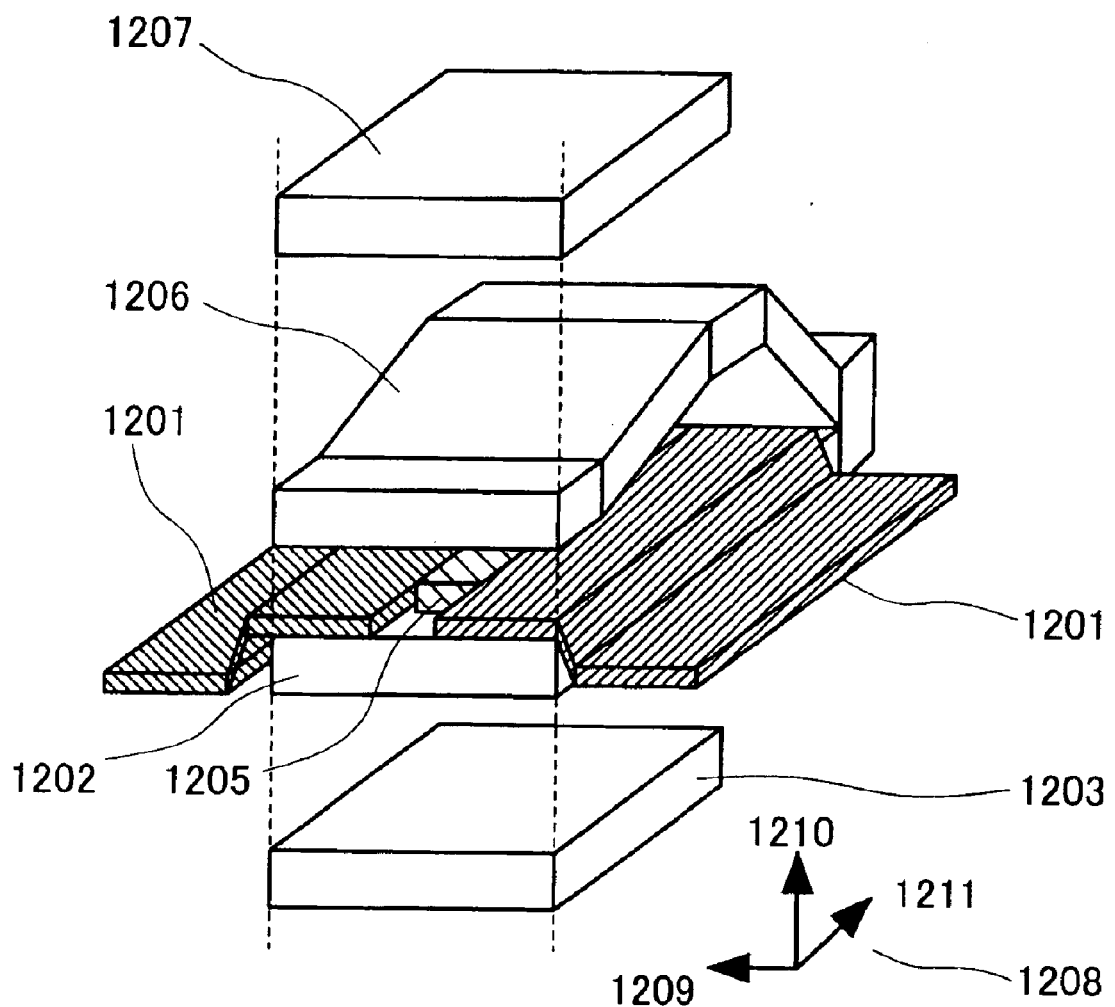
FIG. 12 is a drawing showing an example of a yoke structure.

FIG. 12 is an elevation view illustrating a typical yoke structure and a magnetic domain-control film schematically.

The arrow 1208 indicates each direction in the device. Reference numeral 1209 denotes a track width direction; 1210, a film thickness direction; and 1211, a device height direction.

The structure illustrated in FIG. 12 adopts the one in which a magnetic sensor film 1205 is not exposed to a plane facing a medium. Herein, the structure was fabricated, in which in a gap sandwiched by a lower magnetic shield 1203 and an upper magnetic shield 1207 shown in FIG. 12, which are formed of $Ni_{81}Fe_{19}$, a yoke film formed of a similar soft magnetic material to the shields 1203 and 1207 was sandwiched therebetween. In FIG. 12, the yoke film has a C-ring shape in which an upper yoke 1206 and a lower yoke 1202 are jointed. Besides this structure, the following structures may be conceived. Specifically, a structure in which the lower yoke is thinned in its tip, a structure in which the lower yoke is formed to a thick film, and a structure in which the yoke films are made to be discontinuous under the magnetic sensor may be adopted. In FIG. 12, a magnetic domain-control film is denoted by reference numeral 1201. With such a structure, at least the lower yoke 1202 and the magnetic sensor film 1205 undergo a magnetic domain control, and there is no branch. As a structure of the magnetic domain-control film 1201, a structure in which the upper and lower yoke films and the magnetic sensor film are simultaneously subjected to the magnetic domain-control may be adopted, and a structure in which the upper and lower yoke films and the magnetic sensor film are separately subjected to the magnetic domain-control may also be adopted. In any structure, there is no branch, and a good magnetic domain-control is possible.

Figure 13:
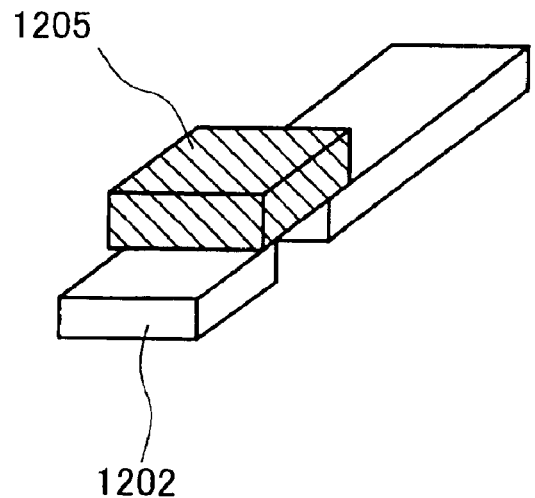
FIG. 13 is a drawing showing an example of a positional relation between a yoke and a magnetic sensor.
Figure 14:
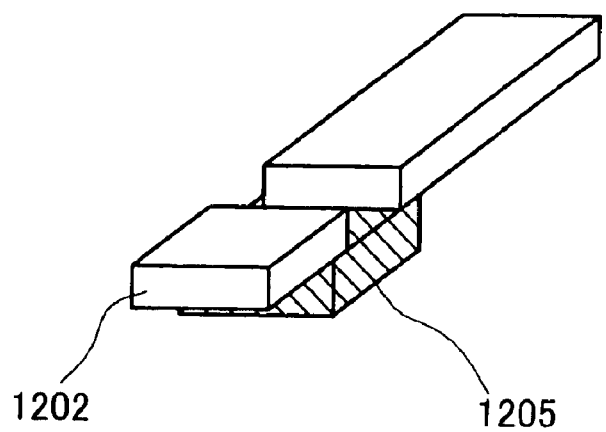
FIG. 14 is a drawing showing an another example of the positional relation between the yoke and the magnetic sensor.

Although the position of the magnetic domain-control film of the yoke structure is simply illustrated in FIG. 12, the magnetic recording head are actually fabricated to the structure as shown in FIG. 10 or in FIG. 11. Moreover, as shown in FIG. 13 or FIG. 14, also in the structure in which the yoke films are made to be discontinuous in the portion of the yoke films contacting the sensor film, in order to increase a quantity of magnetic fluxes sensed by the magnetic sensor film, it is possible to form the magnetic domain-control film by forming the magnetic domain-control film of a high resistivity material. Since, in these magnetic field sensors, magnetic permeability of the sensor film becomes about 1000 times that of a sensor film formed by a semiconductor, it is possible to effectively utilize the magnetic field from the medium.

The magnetic field sensed in this structure is a component applied in the in-plane direction of the sensor film. Accordingly, if this structure is subjected to a perpendicular magnetic recording, a structure which senses a stray magnetic field in a recording portion of the medium can be fabricated. If this structure is subjected to an in-plane recording, a structure which senses a stray field in a recording end portion can be fabricated.

In this embodiment, the above-described magnetic sensor film was used, and deterioration of reproduction properties due to a conduction of the magnetic resistance change film and the magnetic domain-control film was not recognized even if a reproduction shield gap (inter-gap distance) is equal to 80 nm or less.

[Embodiment 4]

Figure 15:
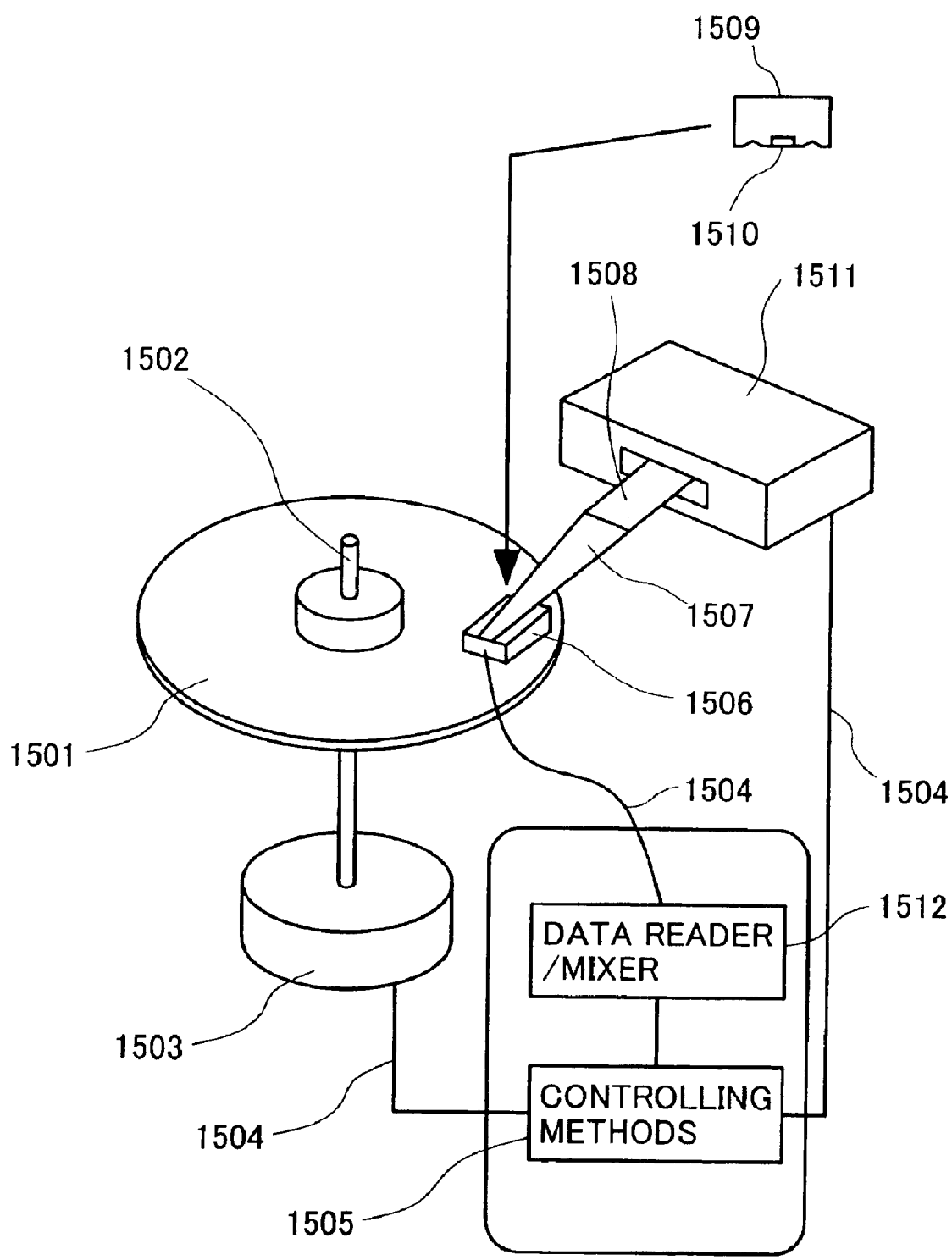
FIG. 15 is a schematic view showing a structure of a magnetic recording/reproduction apparatus and an operation thereof.

FIG. 15 is a schematic view showing an example of a magnetic disc apparatus using the magnetic reading head of the present invention. This magnetic disc apparatus comprises: a magnetic disc 1501 as a magnetic recording medium formed to a disc shape, the magnetic disc 1501 being for recording data in a recording area called concentric tracks; the magnetic head 1503 of the present invention composed of a magnetic transducer, the magnetic head 1503 being for carrying out reading/writing of the foregoing data; actuating means 1511 for supporting the magnetic head 1506 and for allowing the magnetic head 1506 to move to a predetermined position on the magnetic disc 1501; and control means 1505 for controlling transmission/receiving of data which is read and written by the magnetic head and a movement of the actuating means 1511. At least one rotative magnetic disc 1501 is supported by a rotation shaft 1502, and allowed to be rotated by a driving motor 1503. At least one slider 1509 is placed on the magnetic disc 1501, and the slider 1509 supports the magnetic field sensor 1510 of the present invention.

Simultaneously with the rotation of the magnetic disc 1501, the slider 1509 moves on the surface of the magnetic disc 1501, whereby a predetermined position where objective data is recorded is accessed. The slider 1509 is fitted to an arm 1508 by a gimbal 1507. The gimbal 1507 possesses slight elasticity, and allows the slider 1509 to closely contact with the magnetic disc 1501. The arm 1508 is fitted to the actuator 1511.

A voice-coil motor (hereinafter referred to as VCM) is used as the actuator 1511. VCM consists of a movable coil placed in a fixed magnetic field, and a movement direction and a movement speed of the coil are controlled by an electrical signal supplied from the control means 1505 via the line 1504. Accordingly, the actuating means of this embodiment is constituted so as to include the slider 1509, the gimbal 1507, the arm 1508, the actuator 1511 and the line 1504.

During an operation of the magnetic disc, an air bearing by the flow of air is produced between the slider 1509 and the disc surface, and the air bearing allows the slider 1509 to float from the surface of the magnetic disc 1501. Therefore, during the operation of the magnetic disc, this air bearing balances slight elasticity of the gimbal 1507, and the slider 1509 is kept so as not to touch the surface of the magnetic disc 1501 and so as to float from the magnetic disc 1501 with a certain distance.

The control means 1505 is usually composed of a logic circuit, a memory, a micro processor and the like. The control means 1505 transmits and receives a control signal via each line, and controls various constituting means of the magnetic disc apparatus. For example, the motor 1503 is controlled by a motor driving signal transmitted via the line 1504. The actuator 1511 is controlled by a head position control signal and a seek control signal via the line 1504 so as to optimally move and position the selected slider 1509 to an objective data track on the related magnetic disc 1501.

A data reproduction/decoding system 1512 receives and decodes an electrical signal via the line 1504, the electrical signal being obtained from data which is read from the magnetic disc 1501 by the magnetic head 1506 and converted thereinto. Furthermore, the data reproduction/decoding system 1512 transmits an electrical signal, which is to be written into the magnetic disc 1501 as data, to the magnetic head 1506 via the line 1504. Specifically, the data reproduction/decoding system 1512 controls the transmission/receiving of information to be read out and written by the magnetic head 1506. Moreover, there are, for example, an access control signal and a clock signal as a control signal. In addition, the magnetic disc apparatus has a plurality of magnetic discs, actuators and the like, and the actuator may have a plurality of magnetic heads. Possession of the plurality of mechanisms makes it possible to constitute a so-called disc array apparatus.

[Embodiment 5]

FIG. 16 is a schematic view showing an example of a magnetic storage device having an MRAM structure using the magnetic field sensor of the present invention. A plan view of the magnetic storage device and a cross-sectional view thereof are illustrated in FIG. 16. The MRAM structure shown in FIG. 16 has a structure that a plurality of cells are in parallel arranged, each cell comprising: a magnetic field sensor 1606 for recording information; a line 1609 connected to the magnetic field sensor 1606, the line allowing a current to flow through a device; a bit line 1607 connected to a sensor film, the bit line 1607 transmitting an output voltage signal in a direction approximately in parallel with the line 1609 from a terminal in response to the current from the line 1609; a word line 1605 located at a position apart from the sensor film 1606 and opposite to the bit line 1607 so as to sandwich the sensor film 1606 therebetween, the word line 1605 being perpendicular to the bit line 1607 and performing a recording operation for the sensor film 1606; amplifying systems 1601, 1602, 1603, 1604 and 1610 for amplifying a recording signal; and a reading-out word line 1611 for switching reading and writing. This magnetic storage device applies the magnetic sensor containing the magnetic offering the anomalous Hall effect as shown in the embodiment 1 of the present invention to the film constituting the magnetic sensor 1606.

Figure 17:
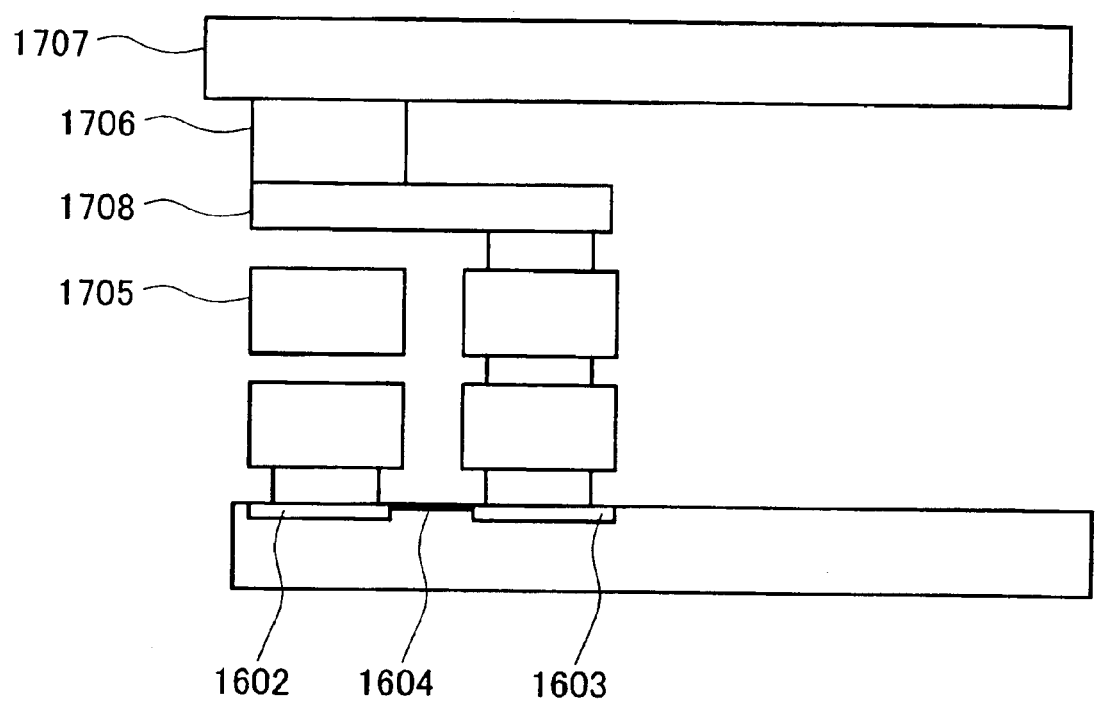
FIG. 17 is a schematic view of a MRAM using a MR film for a sensor film.

First, to show an operation principle of the MRAM, an example of a case where a MR film is used for the sensor film is shown in FIG. 17. Wirings formed of copper wires, which are perpendicular to each other, are provided as a driving line necessary for driving a magnetization vector of the magnetic sensor film. The wirings are referred to as a word line 1705 and a bit line 1707. Generally, a line disposed in parallel to an easy axis of magnetization of a magnetic sensor film 1706 is defined as the word line, and a line perpendicular to the word line is defined as the bit line. The magnetization vector in the film at this time shows different states of the resistance values "1" or "0" in parallel with the easy axis of magnetization. In an ordinary MRAM, the state where the resistance values are different is realized by a structure (A) in which one direction of the in-plane and the film thickness direction are the easy axis of magnetization, and the directions of the current and the magnetization field are in parallel and perpendicular to each other. Alternatively, this state is realized by a structure (B) in which the sensor film is composed of two magnetic films such as a SV film of GMR and the magnetization directions of both of the magnetic films are in parallel and perpendicular to each other. Each of the word line and the bit line generates a magnetic field around them by allowing a current to flow therethrough, and generates a magnetic field acting on the sensor film sandwiched by the word line and the bit line. When a pulse current is allowed to flow through the word line, information is fetched out as a signal in synchronization with a rise-up time as a timing. A current is allowed to flow through the bit line upon a fall of the pulse current, and thus writing is performed. The current flowing through the word line is the one in which the magnetic field acting on the sensor film exceeds an anisotropic magnetic field of a thin film. The current flowing through the bit line is the one necessary for generating a magnetic field which approximately exceeds ½ of a magnetic coercive force of the magnetic sensor film.

Herein, the necessary current is allowed to flow through the word line, and the magnetic field is applied to all of the sensor films under the word line. The magnetic filed applied to the sensor film is directed to the direction of the difficult axis of magnetization in the in-plane thereof. Pulse voltages of different polarities are respectively induced in the bit lines depending on whether the magnetization state rotates from the state (1) where the current and the magnetic field are in parallel with each other or rotates from the state (0) where the current and the magnetic field are perpendicular to each other. The pulse voltage becomes a reading-out voltage. Moreover, during the recording operation, the pulse current is allowed to flow through the bit line in synchronization with the rise-up of the pulse current flowing through the word line, and the direction of the magnetization is determined by the magnetic field from the bit line in the state where the magnetization is directed to the difficult axis of magnetization, thus recording the states (1) and (0).

Returning to FIG. 16, a GaAs substrate is used for the CMOS semiconductor substrate 1601, and impurities of a p-type and a n-type are doped into the GaAs substrate. The electrode (gate film) 1610 is provided at a portion between both of the doped regions, thus forming the transistor (MOS transistor). A drain constituting this transistor is denoted by reference numeral 1601, and a source constituting this transistor is denoted by reference numeral 1603. By switching operations of the transistor, an operation of the pulse current flowing through the word line or the bit line is determined.

Herein, the anomalous Hall generator film of the present invention is applied to this sensor film, and an electrode is disposed so that a current flows in the in-plane direction. The easy axis of magnetization of the sensor film is at a position strayed off by 90° from the in-plane direction, and the magnetization can fall in the state where the magnetization is in parallel with the current and in the state where the magnetization is perpendicular thereto. Accordingly, behaviors of MRAM can be shown. However, to adjust the magnetic anisotropy with the difficult axis of magnetization, there is sometimes a case where the device must be extended anisotropically to the direction of the difficult axis of magnetization.

Since the current flows in the direction perpendicular to the film plane or flows in one direction of the film plane, the sensor film can be similarly used as the magnetic field sensor. Moreover, in terms of the size of the magnetic field sensor device, one side thereof is 0.2 to 0.25 $\mu$m. In the structure using TMR made by IBM corp. for the sensor film, a sensor showing power consumption of 5 mW (reading) and 40 mW (writing), writing time of 10 ns, reading-out time of 10 ns and a cell area of 49 $F^2$ is fabricated. When the anomalous Hall effect film is applied to this structure, a speed and the like is approximately equal to that of IBM structure, and a resistance value of the sensor film can be reduced. Accordingly, there is a possibility that power consumption can be suppressed to be low. When the magnetization direction of this sensor film is rotated, a resistance value for the magnetic field varies upon generation of a magnetic domain, and S/N is lowered. Accordingly, the stored data cannot be read out. To read out the data with good controllability, a magnetic domain-control film is required. By positioning this magnetic domain-control film at both ends of the magnetic field sensor 1606, it is possible to control the magnetic domain without a loss due to a branch to the magnetic domain-control film.

The present invention also provide the following magnetic field sensor, magnetic reading head, and magnetic storage device.

(1) A magnetic field sensor comprises: a plurality of magnetic field sub-sensors, each magnetic field sub-sensor including a film of a first electrode; a magnetic film showing an anomalous Hall effect, formed on the film of the first electrode; a film of a second electrode formed on the magnetic film; and third and fourth electrodes respectively connected to two regions provided so as to be apart from each other along a film plane direction of the magnetic film and each magnetic field sub-sensor allowing a current to flow between the first and second electrodes and detecting a voltage generated between the third and fourth electrodes, wherein electrodes for detecting voltages at the respective magnetic field sub-sensors are connected in series; and the respective electrodes are connected so that a current flowing through at least one magnetic field sub-sensor flows in an opposite direction to currents of other magnetic field sub-sensors.

(2) A magnetic field sensor comprises: a plurality of magnetic field sub-sensors, each including a film of a first electrode; a magnetic film showing an anomalous Hall effect, formed on the film of the first electrode; a film of a second electrode formed on the magnetic film; and third and fourth electrodes respectively connected to two regions provided so as to be apart from each other along a film plane direction of the magnetic film and each magnetic field sub-sensor allowing a current to flow between the third and fourth electrodes and detecting a voltage generated between the first and second electrodes voltages, wherein electrodes for detecting voltages at the respective magnetic field sub-sensors are connected in series; and the respective electrodes are connected so that a current flowing through at least one magnetic field sub-sensor flows in an opposite direction to currents of other magnetic field sub-sensors.

(3) A magnetic reading head using the magnetic field sensor defined in any one of claims 1 to 7, the magnetic reading head comprising: a pair of magnetic shields composed of a lower magnetic shield and an upper magnetic shield; and a magnetic field sensor arranged between the pair of magnetic shields.

(4) A magnetic reading head which comprises: a pair of magnetic shields composed of a lower magnetic shield and an upper magnetic shield; and a magnetic field sensor arranged between the pair of magnetic shields, the magnetic field sensor comprising: a film of a first electrode; a first magnetic film showing an anomalous Hall effect, formed on the film of the first electrode; a film of a second electrode formed on the first magnetic film; a second magnetic film showing an anomalous Hall effect, formed on the film of the second electrode; and a film of a third electrode formed on the second magnetic film, wherein currents are allowed to flow through the first and second magnetic films, the currents flowing in the same direction and approximately in a parallel direction to planes of the first and second magnetic films facing a medium, and a voltage generated between the films of the first and third electrodes is detected.

(5) A magnetic reading head which comprises: a pair of magnetic shields composed of a lower magnetic shield and an upper magnetic shield; and a magnetic field sensor arranged between the pair of magnetic shields, the magnetic field sensor comprising: a film of a first electrode; a first magnetic film showing an anomalous Hall effect, formed on the film of the first electrode; a film of a second electrode formed on the first magnetic film; a second magnetic film showing an anomalous Hall effect, formed on the film of the second electrode; and a film of a third electrode formed on the second magnetic film, wherein a current is supplied between the films of the first and third electrodes, and voltages generated respectively in the first and second magnetic films approximately in a parallel direction to planes of the first and second magnetic films facing a medium are synthesized to be detected.

(6) A magnetic reading head which comprises: a pair of magnetic shields composed of a lower magnetic shield and an upper magnetic shield; a magnetic yoke film arranged between the pair of magnetic shields, the magnetic yoke film extending in a device height direction from a position exposed to a plane opposite to a medium so as to introduce a magnetic field to the inside; and a magnetic field sensor, the magnetic field sensor including; a film of a first electrode; a magnetic film showing an anomalous Hall effect, formed on the film of the first electrode; a film of a second electrode formed on the magnetic film; and third and forth electrodes respectively connected to two regions provided so as to be apart from each other along a film plane direction of the magnetic film and the magnetic field sensor being disposed at a section portion of the magnetic yoke film at a position retreating from the plane of the magnetic yoke film opposite to the medium.

(7) The magnetic reading head defined in any one of items (4), (5) and (6), wherein the magnetic field sensor has a length in a direction parallel to the medium plane, which is longer than that in a direction perpendicular to the medium plane.

(8) A magnetic storage device having a structure in which a plurality of cells are provided in parallel with each other, each cell comprising: a magnetic field sensor film for recording information; a bit line connected to the magnetic field sensor film; a word line for performing a recording operation for the magnetic field sensor film, the word line being located at a position apart from the magnetic field sensor film and facing the bit line with the magnetic field sensor film sandwiched therebetween so as to be perpendicular to the bit line; an amplifying system for amplifying a record signal; and a reading-out word line for switching reading/writing operations, wherein a magnetic field sensor is the one defined in any one of claims 1 to 7 and above items (1) and (2), which includes a ferromagnetic film showing an anomalous Hall effect.

According to the present invention, the anomalous Hall effect can be used for the magnetic field sensor, the magnetic reading head, the sensor portion of the storage device and the magnetic recording/reproduction apparatus, and a high output can be expected even when the device size is small. The anomalous Hall effect itself tends to increase when the device size is small, and effective high density recording can be brought about. Moreover, the magnetic field sensor of the present invention can be utilized as a head regardless of a recording method for the medium.

What is claimed is:

1. A magnetic field sensor comprising:

a plurality of magnetic field sub-sensors, each magnetic field sub-sensor including a film of a first electrode;

a magnetic film showing an anomalous Hall effect formed on the film of the first electrode;

a film of a second electrode formed on the magnetic film; and third and fourth electrodes respectively connected to two regions provided so as to be apart from each other along a film plane direction of the magnetic film and each magnetic field sub-sensor allowing a current to flow between the first and second electrodes and detecting a voltage generated between the third and fourth electrodes, wherein electrodes for detecting voltages at the respective magnetic field sub-sensors are connected in series, and wherein the respective electrodes are connected so that a current flowing through at least one magnetic field sub-sensor flows in an opposite direction to currents of other magnetic field sub-sensors.

2. A magnetic field sensor comprising:

a plurality of magnetic field sub-sensors, each including a film of a first electrode;

a magnetic film showing an anomalous Hall effect formed on the film of the first electrode;

a film of a second electrode formed on the magnetic film; and third and fourth electrodes respectively connected to two regions provided so as to be apart from each other along a film plane direction of the magnetic film and each magnetic field sub-sensor allowing a current to flow between the third and fourth electrodes and detecting a voltage generated between the first and second electrodes voltages, wherein electrodes for detecting voltages at the respective magnetic field sub-sensors are connected in series, and wherein respective electrodes are connected so that a current flowing through at least one magnetic field sub-sensor flows in an opposite direction to currents of other magnetic field sub-sensors.

3. A magnetic reading head using a magnetic field sensor, wherein said magnetic field sensor comprises:

a film of a first electrode, a magnetic film showing an anomalous Hall effect, formed on said film of the first electrode, a film of a second electrode formed on said magnetic film, and third and fourth electrodes respectively connected to two regions provided so as to be apart from each other along a film plane direction of said magnetic film, wherein said magnetic film is one of a ferromagnetic film and an anti-magnetic film formed of a compound consisting of at least one type of element selected among iron, cobalt, nickel, manganese, vanadium and chromium, and a semiconductor material having a zincblende type structure, which contains at least one of gallium, arsenic, indium, antimony, silicon, germanium, tellurium, zinc oxide and titanium oxide, wherein said magnetic film is one of a ferromagnetic film and an anti-magnetic film formed by laminating a semiconductor material which contains at least one type of element selected among iron, cobalt, nickel, manganese, vanadium and chromium, and which contains at least one of gallium, arsenic, indium, antimony, silicon, germanium, tellurium, zinc oxide and titanium oxide, wherein said magnetic film is one of a ferromagnetic film and an antiferromagnetic film having a perovskite structure which contains not less than three elements, the elements being selected among lanthanum, strontium, calcium, manganese, boron, copper and oxygen, and wherein the magnetic reading head comprises:

a pair of magnetic shields composed of a lower magnetic shield and an upper magnetic shield, and the magnetic field sensor arranged between the pair of magnetic shields.

4. A magnetic reading head using a magnetic field sensor, wherein said magnetic field sensor comprises:

a film of a first electrode, a magnetic film showing an anomalous Hall effect, formed on said film of the first electrode, a film of a second electrode formed on said magnetic film, and third and fourth electrodes respectively connected to two regions provided so as to be apart from each other along a film plane direction of said magnetic film, wherein a current is allowed to flow between said first and second electrodes and a voltage generated between said third and fourth electrodes is detected, wherein said magnetic reading head comprises:

a pair of magnetic shields composed of a lower magnetic shield and an upper magnetic shield, and the magnetic field sensor arranged between the pair of magnetic shields.

5. A magnetic reading head using a magnetic field sensor, wherein said magnetic field sensor comprises:

a film of a first electrode, a magnetic film showing an anomalous Hall effect, formed on said film of the first electrode, a film of a second electrode formed on said magnetic film, and third and fourth electrodes respectively connected to two regions provided so as to be apart from each other along a film plane direction of said magnetic film, wherein a current is allowed to flow between said third and fourth electrodes and a voltage generated between said first and second electrodes is detected, and wherein said magnetic reading head comprises:

a pair of magnetic shields composed of a lower magnetic shield and an upper magnetic shield, and the magnetic field sensor arranged between the pair of magnetic shields.

6. A magnetic reading head which comprising:

a pair of magnetic shields composed of a lower magnetic shield and an upper magnetic shield; and a magnetic field sensor arranged between the pair of magnetic shields, wherein said magnetic field sensor comprises:

a film of a first electrode, a first magnetic film showing an anomalous Hall effect formed on the film of the first electrode, a film of a second electrode formed on the first magnetic film, a second magnetic film showing an anomalous Hall effect formed on the film of the second electrode, and a film of a third electrode formed on the second magnetic film, wherein currents are allowed to flow through the first and second magnetic films, said currents flowing in the same direction and approximately in a parallel direction to planes of said first and second magnetic films facing a medium, and a voltage generated between the films of the first and third electrodes is detected.

7. The magnetic reading head according to claim 6, wherein the magnetic field sensor has a length in a direction parallel to the medium plane, which is longer than that in a direction perpendicular to the medium plane.

8. A magnetic reading head which comprising:

a pair of magnetic shields composed of a lower magnetic shield and an upper magnetic shield; and a magnetic field sensor arranged between the pair of magnetic shields, wherein said magnetic field sensor comprises:

a film of a first electrode, a first magnetic film showing an anomalous Hall effect formed on the film of the first electrode, a film of a second electrode formed on the first magnetic film, a second magnetic film showing an anomalous Hall effect formed on the film of the second electrode, and a film of a third electrode formed on the second magnetic film, wherein a current is supplied between the films of the first and third electrodes, and voltages generated respectively in the first and second magnetic films approximately in a parallel direction to planes of the first and second magnetic films facing a medium are synthesized to be detected.

9. The magnetic reading head according to claim 8, wherein the magnetic field sensor has a length in a direction parallel to the medium plane, which is longer than that in a direction perpendicular to the medium plane.

10. A magnetic reading head which comprising:

a pair of magnetic shields composed of a lower magnetic shield and an upper magnetic shield;

a magnetic yoke film arranged between the pair of magnetic shields, the magnetic yoke film extending in a device height direction from a position exposed to a plane opposite to a medium so as to introduce a magnetic field to the inside; and a magnetic field sensor, the magnetic field sensor including; a film of a first electrode;

a magnetic film showing an anomalous Hall effect formed on the film of the first electrode;

a film of a second electrode formed on the magnetic film; and third and forth electrodes respectively connected to two regions provided so as to be apart from each other along a film plane direction of the magnetic film and the magnetic field sensor being disposed at a section portion of the magnetic yoke film at a position retreating from the plane of the magnetic yoke film opposite to the medium.

11. The magnetic reading head according to claim 10, wherein the magnetic field sensor has a length in a direction parallel to the medium plane, which is longer than that in a direction perpendicular to the medium plane.

12. A magnetic storage device having a structure in which a plurality of cells are provided in parallel with each other, each cell comprising:

a magnetic field sensor film for recording information;

a bit line connected to the magnetic field sensor film;

a word line for performing a recording operation for the magnetic field sensor film, the word line being located at a position apart from the magnetic field sensor film and facing the bit line with the magnetic field sensor film sandwiched therebetween so as to be perpendicular to the bit line;

an amplifying system for amplifying a record signal; and a reading-out word line for switching reading/writing operations, wherein a magnetic field sensor used for sensing the recording information comprises:

a film of a first electrode, a magnetic film showing an anomalous Hall effect, formed on said film of the first electrode, a film of a second electrode formed on said magnetic film, and third and fourth electrodes respectively connected to two regions provided so as to be apart from each other along a film plane direction of said magnetic film, wherein said magnetic film is one of a ferromagnetic film and an anti-magnetic film formed of a compound consisting of at least one type of element selected among iron, cobalt, nickel, manganese, vanadium and chromium, and a semiconductor material having a zincblende type structure, which contains at least one of gallium, arsenic, indium, antimony, silicon, germanium, tellurium, zinc oxide and titanium oxide, wherein said magnetic film is one of a ferromagnetic film and an anti-magnetic film formed by laminating a semiconductor material which contains at least one type of element selected among iron, cobalt, nickel, manganese, vanadium and chromium, and which contains at least one of gallium, arsenic, indium, antimony, silicon, germanium, tellurium, zinc oxide and titanium oxide, wherein said magnetic film is one of a ferromagnetic film and an antiferromagnetic film having a perovskite structure which contains not less than three elements, the elements being selected among lanthanum, strontium, calcium, manganese, boron, copper and oxygen.

13. A magnetic storage device having a structure in which a plurality of cells are provided in parallel with each other, each cell comprising:

a magnetic field sensor film for recording information;

a bit line connected to the magnetic field sensor film;

a word line for performing a recording operation for the magnetic field sensor film, the word line being located at a position apart from the magnetic field sensor film and facing the bit line with the magnetic field sensor film sandwiched therebetween so as to be perpendicular to the bit line;

an amplifying system for amplifying a record signal; and a reading-out word line for switching reading/writing operations, wherein a magnetic field sensor used for sensing the recording information comprises:

a film of a first electrode, a magnetic film showing an anomalous Hall effect, formed on said film of the first electrode, a film of a second electrode formed on said magnetic film, and third and fourth electrodes respectively connected to two regions provided so as to be apart from each other along a film plane direction of said magnetic film, wherein a current is allowed to flow between said first and second electrodes and a voltage generated between said third and fourth electrodes is detected.

14. A magnetic storage device having a structure in which a plurality of cells are provided in parallel with each other, each cell comprising:

a magnetic field sensor film for recording information;

a bit line connected to the magnetic field sensor film;

a word line for performing a recording operation for the magnetic field sensor film, the word line being located at a position apart from the magnetic field sensor film and facing the bit line with the magnetic field sensor film sandwiched therebetween so as to be perpendicular to the bit line;

an amplifying system for amplifying a record signal; and a reading-out word line for switching reading/writing operations, wherein a magnetic field sensor used for sensing the recording information comprises:

a film of a first electrode, a magnetic film showing an anomalous Hall effect, formed on said film of the first electrode, a film of a second electrode formed on said magnetic film, and third and fourth electrodes respectively connected to two regions provided so as to be apart from each other along a film plane direction of said magnetic film, wherein a current is allowed to flow between said third and fourth electrodes and a voltage generated between said first and second electrodes is detected.

* * * * *